United States Patent
Kim et al.

(10) Patent No.: US 10,497,650 B2
(45) Date of Patent: Dec. 3, 2019

(54) SEMICONDUCTOR DEVICE AND MANUFACTURING METHOD THEREOF

(71) Applicant: Amkor Technology, Inc., Tempe, AZ (US)

(72) Inventors: Soo Hyun Kim, Seoul (KR); Jae Min Na, Gyeonggi-do (KR); Dae Gon Kim, Gyeonggi-do (KR); Tae Kyung Hwang, Seoul (KR); Kwang Mo Chris Lim, Seoul (KR); SungSun Park, Seoul (KR); KyeRyung Kim, Gyeonggi-do (KR)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 15/487,024

(22) Filed: Apr. 13, 2017

(65) Prior Publication Data

US 2018/0301420 A1    Oct. 18, 2018

(51) Int. Cl.
| | |
|---|---|
| *H01L 23/552* | (2006.01) |
| *H01L 21/56* | (2006.01) |
| *H01L 25/065* | (2006.01) |
| *H01L 23/00* | (2006.01) |
| *H01L 23/498* | (2006.01) |
| *H01L 23/66* | (2006.01) |

(Continued)

(52) U.S. Cl.
CPC ........ *H01L 23/552* (2013.01); *H01L 21/4885* (2013.01); *H01L 21/563* (2013.01); *H01L 21/6836* (2013.01); *H01L 21/78* (2013.01); *H01L 23/3128* (2013.01); *H01L 23/49838* (2013.01); *H01L 23/66* (2013.01); *H01L 24/14* (2013.01); *H01L 24/46* (2013.01); *H01L 25/0655* (2013.01); *H01L 2221/6834* (2013.01); *H01L 2221/68327* (2013.01); *H01L 2223/6677* (2013.01); *H01L 2224/16225* (2013.01); *H01L 2224/48091* (2013.01); *H01L 2224/73257* (2013.01); *H01L 2224/78301* (2013.01); *H01L 2924/19105* (2013.01); *H01L 2924/3025* (2013.01)

(58) Field of Classification Search
CPC ... H01L 23/552–556; H01L 2223/6677; H01L 23/60
See application file for complete search history.

(56) References Cited

U.S. PATENT DOCUMENTS

| | | |
|---|---|---|
| 4,925,024 A | 5/1990 | Ellenberger et al. |
| 5,166,772 A | 11/1992 | Soldner et al. |

(Continued)

FOREIGN PATENT DOCUMENTS

WO    WO-2017171813 A1 *   10/2017   ............ H01L 24/49

*Primary Examiner* — Charles D Garber
*Assistant Examiner* — Alia Sabur
(74) *Attorney, Agent, or Firm* — McAndrews, Held & Malloy, Ltd.

(57) ABSTRACT

A semiconductor device having an EMI shield layer and/or EMI shielding wires, and a manufacturing method thereof, are provided. In an example embodiment, the semiconductor device includes a semiconductor die, an EMI shield layer shielding the semiconductor die, and an encapsulating portion encapsulating the EMI shield layer. In another example embodiment, the semiconductor device further includes EMI shielding wires extending from the EMI shield layer and shielding the semiconductor die.

19 Claims, 22 Drawing Sheets

(51) Int. Cl.
*H01L 21/78* (2006.01)
*H01L 21/683* (2006.01)
*H01L 23/31* (2006.01)
*H01L 21/48* (2006.01)

(56) References Cited

U.S. PATENT DOCUMENTS

| | | | |
|---|---|---|---|
| 5,416,358 A | 5/1995 | Ochi et al. | |
| 5,468,999 A | 11/1995 | Lin et al. | |
| 5,473,191 A | 12/1995 | Tanaka | |
| 5,557,142 A | 9/1996 | Gilmore et al. | |
| 5,614,694 A | 3/1997 | Gorenz, Jr. et al. | |
| 5,639,989 A | 6/1997 | Higgins, III | |
| 5,650,659 A * | 7/1997 | Mostafazadeh | H01L 23/315 |
| | | | 257/659 |
| 5,656,864 A | 8/1997 | Mitsue et al. | |
| 5,694,300 A | 12/1997 | Mattel et al. | |
| 5,907,477 A | 5/1999 | Tuttle et al. | |
| 5,940,271 A | 8/1999 | Mertol | |
| 6,136,131 A | 10/2000 | Sosnowski | |
| 6,194,655 B1 | 2/2001 | Lange, Sr. et al. | |
| 6,246,115 B1 | 6/2001 | Tang et al. | |
| 6,423,570 B1 | 7/2002 | Ma et al. | |
| 6,433,420 B1 | 8/2002 | Yang et al. | |
| 6,465,280 B1 | 10/2002 | Martin et al. | |
| 6,522,762 B1 | 2/2003 | Mullenborn et al. | |
| 6,602,737 B2 | 8/2003 | Wu | |
| 6,686,649 B1 | 2/2004 | Mathews et al. | |
| 6,781,231 B2 | 8/2004 | Minervini | |
| 7,030,469 B2 | 4/2006 | Mahadevan et al. | |
| 7,166,910 B2 | 1/2007 | Minervini | |
| 7,202,552 B2 | 4/2007 | Zhe et al. | |
| 7,242,089 B2 | 7/2007 | Minervini | |
| 7,381,049 B2 | 6/2008 | Li et al. | |
| 7,381,589 B2 | 6/2008 | Minervini | |
| 7,434,305 B2 | 10/2008 | Minervini | |
| 7,439,616 B2 | 10/2008 | Minervini | |
| 7,501,703 B2 | 3/2009 | Minervini | |
| 7,537,964 B2 | 5/2009 | Minervini | |
| 8,012,868 B1 | 9/2011 | Naval et al. | |
| 8,018,049 B2 | 9/2011 | Minervini | |
| 8,030,722 B1 | 10/2011 | Bolognia et al. | |
| 8,115,283 B1 | 2/2012 | Bolognia et al. | |
| 2002/0089832 A1 | 7/2002 | Huang | |
| 2003/0067757 A1 | 4/2003 | Richardson et al. | |
| 2005/0067676 A1 * | 3/2005 | Mahadevan | H01L 21/561 |
| | | | 257/659 |
| 2005/0207605 A1 | 9/2005 | Dehe et al. | |
| 2005/0280139 A1 | 12/2005 | Zhao et al. | |
| 2006/0157841 A1 | 7/2006 | Minervini | |
| 2007/0018334 A1 | 1/2007 | Peytavy et al. | |
| 2007/0030661 A1 | 2/2007 | Morris et al. | |
| 2007/0201715 A1 | 8/2007 | Minervini | |
| 2007/0215962 A1 | 9/2007 | Minervini et al. | |
| 2007/0241440 A1 | 10/2007 | Hoang et al. | |
| 2008/0000988 A1 | 1/2008 | Farooq et al. | |
| 2008/0014678 A1 | 1/2008 | Howard et al. | |
| 2008/0150095 A1 | 6/2008 | Yang et al. | |
| 2008/0315385 A1 | 12/2008 | Gerber et al. | |
| 2009/0079041 A1 * | 3/2009 | Huang | H01L 21/561 |
| | | | 257/660 |
| 2009/0218668 A1 | 9/2009 | Zhe et al. | |
| 2012/0104629 A1 | 5/2012 | Bolognia et al. | |
| 2012/0193770 A1 * | 8/2012 | Yamada | H01L 21/561 |
| | | | 257/659 |
| 2013/0225102 A1 * | 8/2013 | Tsutsumi | H01L 23/552 |
| | | | 455/90.2 |
| 2017/0077039 A1 * | 3/2017 | Liao | H01L 23/552 |
| 2017/0186697 A1 * | 6/2017 | Dias | H01L 23/552 |
| 2018/0114762 A1 * | 4/2018 | Chiu | H01L 23/552 |

* cited by examiner

SEMICONDUCTOR DEVICE AND MANUFACTURING METHOD THEREOF

BACKGROUND

Embodiments of the present disclosure provide a semiconductor device and a manufacturing method thereof.

Recent electronic devices, such as smartphones, laptop computers, and tablet computers, include multiple wireless semiconductor devices to be equipped with wireless communication functions. The wireless semiconductor devices generate electromagnetic noise due to clock frequencies of built-in integrated circuits and a high data transmission speed. In order to suppress the electromagnetic noise, a substrate-level "metal shield" method has conventionally been used. However, the substrate-level "metal shield" method involves a complex manufacturing process that may result in low productivity and poor yield. Moreover, the complex manufacturing process may impede miniaturization and slimming of an electronic device employing the same.

BRIEF SUMMARY

Semiconductor devices including a semiconductor die and/or an encapsulating portion treated with EMI shielding are substantially shown in and/or described in connection with at least one of the figures, and are set forth more completely in the claims.

Various advantages, aspects and novel features of the present disclosure, as well as details of various illustrated example supporting embodiments, will be more fully understood from the following description and drawings.

BRIEF DESCRIPTION OF THE DRAWINGS

Common reference numerals are used throughout the drawings and the detailed description to indicate the same or similar elements.

DETAILED DESCRIPTION

As utilized herein, "and/or" means any one or more of the items in the list joined by "and/or". As an example, "x and/or y" means any element of the three-element set {(x), (y), (x, y)}. That is, "x and/or y" means "one or both of x and y." As another example, "x, y, and/or z" means any element of the seven-element set {(x), (y), (z), (x, y), (x, z), (y, z), (x, y, z)}. That is, "x, y, and/or z" means "one or more of x, y, and z." As utilized herein, the terms "e.g.," and "for example" set off lists of one or more non-limiting examples, instances, or illustrations.

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," "top," "bottom," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

Figure 1A:
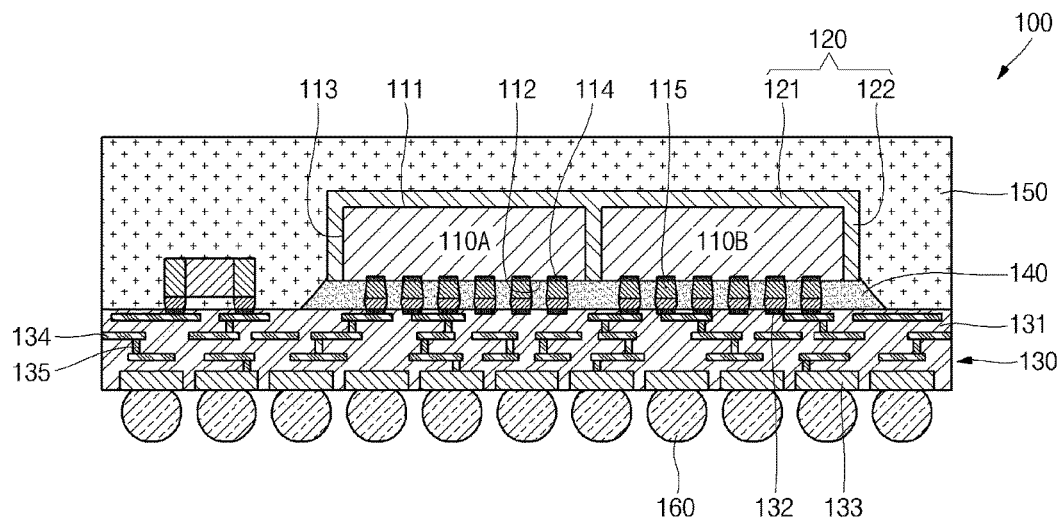
FIGS. 1A and 1B are cross-sectional views of a semiconductor device according to various example embodiments of the present disclosure and semiconductor dies each having an EMI shield layer.
Figure 1B:
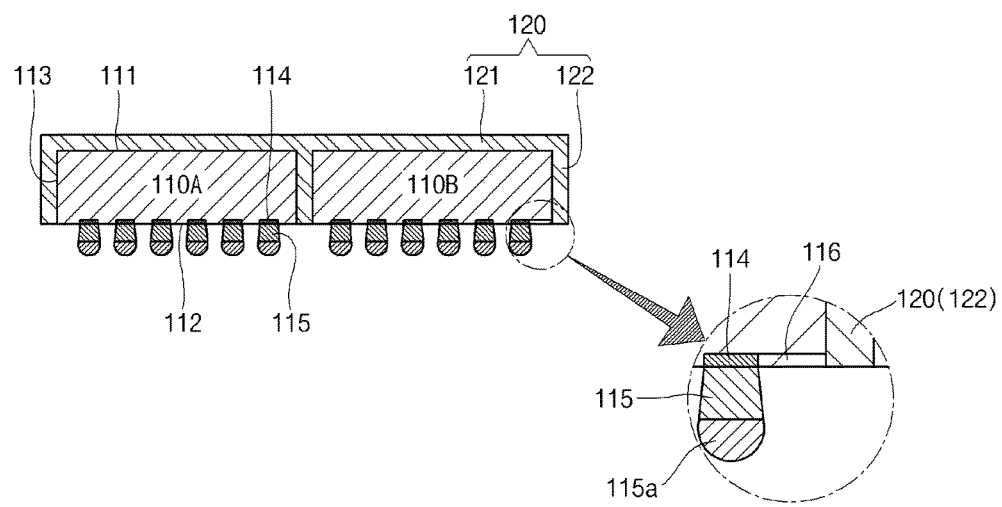

Referring to FIGS. 1A and 1B, cross-sectional views of a semiconductor device 100 are provided in accordance with various example embodiments of the present disclosure. As illustrated, the semiconductor device 100 may include semiconductor dies 110A and 110B, an EMI shield layer 120, a substrate 130, and an encapsulating portion 150. In addition, the semiconductor device 100 may further include external interconnection structures 160.

Each of the semiconductor dies 110A and 110B may have a substantially planar first surface 111, a substantially planar second surface 112 opposite to the first surface 111, and third surfaces 113 formed between the first surface 111 and the second 112. In addition, each of the semiconductor dies 110A and 110B may include at least one or more contact pads 114 (e.g., bonding pads or redistribution pads) formed on the second surface 112, and at least one or more internal interconnection structures 115 connected to the internal contact pads 114. Substantially, the first surface 111 may include a top surface of each of the semiconductor dies 110A and 110B, the second surface 112 may include a bottom surface of each of the semiconductor dies 110A and 110B, and the third surface may include one or more of the four side surfaces of each of the semiconductor dies 110A and 110B.

The semiconductor device 100 is shown with two semiconductor dies 110A and 110B in FIGS. 1A and 1B. However, the semiconductor device 100, in some embodiments, may include a single semiconductor die or more than two semiconductor dies.

Examples of the internal interconnection structures 115 may include, but are not limited to, various types of structures, such as micro bumps, metal pillars, solder bumps, or solder balls, that electrically bond the semiconductor dies 110A and 110B to the substrate 130. In an example, the internal interconnection structures 115 may include copper pillars having solder bumps or solder caps 115a that are bonded to the substrate 130 by reflowing or thermal compression. The internal interconnection structures 115 may have, but are not limited to, a pitch of approximately 20-50 micrometers (μm) and/or a pitch of approximately 90-100 μm.

Meanwhile, the semiconductor dies 110A and 110B may include integrated circuit dies separated from a semiconductor wafer and examples thereof may include, but are not limited to, electric circuits, such as digital signal processors (DSPs), microprocessors, network processors, power management processors, audio processors, RF circuits, wireless baseband system-on-chip (SoC) processors, sensors, and application specific integrated circuits (ASICs).

The EMI shield layer 120 may include a substantially planar first conductive layer 121 that shields the first surfaces 111 of the semiconductor dies 110A and 110B, and substantially planar second conductive layers 122 that shield the third surfaces 113 of the semiconductor dies 110A and 110B. In this manner, the first conductive layer 121 and the second conductive layers 122 may provide a EMI shield layer 120 having a cap shape that shields top surfaces and four side surfaces of the semiconductor dies 110A and 110B. In addition, when the semiconductor device 100 includes the first semiconductor die 110A horizontally spaced from the second semiconductor die 110B, the EMI shield layer 120 may fill a gap between the first and second semiconductor dies 110A and 110B. In particular, the second conductive layer 122 of the EMI shield layer 120 may be configured such that second conductive layer 122 is inserted into a region between third surfaces 113 of the first and second semiconductor dies 110A and 110B.

The EMI shield layer 120 may prevent electromagnetic waves generated from the semiconductor dies 110A and 110B from being radiated to the outside. Moreover, the EMI shield layer 120 may prevent externally applied electromagnetic waves from entering the semiconductor dies 110A and 110B. Throughout the detailed description, such functions of the EMI shield layer 120 may be referred to as EMI shielding.

To enable shielding of electromagnetic waves, the EMI shield layer 120 may be formed using various conductive materials. Examples of suitable conductive materials for the EMI shield layer 120 may include, but are not limited to, copper (Cu), nickel (Ni), gold (Au), silver (Ag), platinum (Pt), cobalt (Co), titanium (Ti), chromium (Cr), zirconium (Zr), molybdenum (Mo), ruthenium (Ru), hafnium (Hf), tungsten (W), rhenium (Re), graphite, or carbon black. In some embodiments, the EMI shield layer 120 may further include metal particles and a binder for binding metal particles internal to the EMI shield layer. In other embodiments, the EMI shield layer 120 may further include metal particles and a binder for attaching the metal particles to surfaces of the semiconductor dies 110A and 110B.

In addition, the EMI shield layer 120 may include a conductive polymer, such as polyacetylene, poylaniline, polypyrrole, polythiophene or poly-sulfur-nitride, doped with a metal or metal oxide. Further, the EMI shield layer 120 may comprise conductive ink having a conductive material such as carbon black, graphite, and silver.

A thickness of the EMI shield layer 120 may be in a range of, for example, approximately 0.1 μm to approximately 1000 μm, preferably 1 μm to 100 μm, and more preferably 3 μm to 30 μm, but aspects of the present disclosure are not limited thereto. When the thickness of the EMI shield layer 120 is smaller than 0.1 μm, EMI shielding efficiency of the EMI shield layer 120 may be smaller than a desired threshold value, and when the thickness of the EMI shield layer 120 is greater than 1000 μm, a time required for forming the EMI shield layer 120 may be extended beyond an economically viable time frame.

In addition, the EMI shield layer 120 may be formed, for example, by various non-sputtering processes such as spin coating, spraying, printing, laminating, and/or a combination thereof, but are not limited thereto. As used herein, the term "non-sputtered" and related words and phrases are used to distinguish a layer that has been formed via a sputtering process from a layer such as, for example, EMI shield layer 120 that has been formed via spin coating, spraying, printing, laminating, and/or a combination of such processes. Such non-sputtered layers may possess various advantages over sputtered layers. For example, in comparison to sputtered layers, non-sputtered layers may yield higher UPH (units per hour), lower operational cost, lower tool cost, and better control of the thickness of formed layers, especially along sidewalls.

As described above, the EMI shield layer 120 is not formed on a surface of the encapsulating portion 150 but is instead directly formed on surfaces of the semiconductor dies 110A and 110B (e.g., silicon dies). As such, the semiconductor device 100, according to various embodiments of the present disclosure, may exhibit improved EMI shielding efficiency. In particular, if the EMI shield layer 120 were formed on the external surface of the encapsulating portion 150, the EMI shield layer 120 would be spaced a predetermined gap apart from the semiconductor dies 110A and 110B. Such spacing may allow the electromagnetic waves to be radiated from the semiconductor dies 110A, 110B to the outside or to enter the inside through the gap to the semiconductor dies 110A, 110B. However, with the EMI shield layer 120 directly formed on the surfaces of the semiconductor dies 110A and 110B, there is no gap between the EMI shield layer 120 and each of the semiconductor dies 110A and 110B. As such, the EMI shield layer 120 may considerably suppress the electromagnetic waves from being radiated from the semiconductor dies 110A, 110B to the outside or considerably suppress the electromagnetic waves from entering the semiconductor dies 110A, 110B from the outside.

Moreover, each of the semiconductor dies 110A and 110B may further include a ground circuit pattern 116 connected to the contact pads 114. The ground circuit pattern 116 may be directly electrically connected to the EMI shield layer 120 (see FIG. 1B.). The contact pads 114 may be electrically connected to the internal interconnection structures 115. In addition, the internal interconnection structures 115 may be electrically connected to an upper circuit pattern 132 of the substrate 130. The contact pads 114, the internal interconnection structures 115, and the upper circuit pattern 132 of the substrate 130, may be electrically connected to the ground circuit pattern 116, and may provide structures for grounding. Therefore, the EMI shield layer 120 may be grounded and more efficiently prevent electromagnetic waves from being radiated or induced. In some embodiments, some internal interconnection structures 115 may be used as ground bumps, some internal interconnection structures 115 may be used as signal bumps, and some internal interconnection structures 115 may be used as power bumps. In such embodiments, the ground circuit pattern 116 may be electrically connected to internal interconnection structures 115 used as ground bumps.

The substrate 130 may comprise a mechanical support structure for the semiconductor dies 110A and 110B, and/or passive devices. To this end, the substrate 130 may include a dielectric layer 131 and an upper circuit pattern (e.g., conductive traces) 132 formed on a top surface of the dielectric layer 131. The upper circuit pattern 132 may be electrically connected to the internal interconnection structures 115 of each of the semiconductor dies 110A and 110B. The substrate 130 may further include a lower circuit pattern 133 electrically connected to an external circuit board formed on a bottom surface of the dielectric layer 131. In particular, the substrate 130 may further include a plurality of circuit patterns 134 and vias 135 between the upper circuit pattern 132 and the lower circuit pattern 133. Further, the plurality of circuit patterns 134 and vias 135 may be electrically connected to the upper circuit pattern 132 and/or the lower circuit pattern 133. Examples of the substrate 130 may include, but are not limited to, a rigid printed circuit board, a flexible printed circuit board, a circuit board having a core, a coreless circuit board and a build-up circuit board.

Further, an underfill 140 may further fill a region between each of the semiconductor dies 110A and 110B and the substrate 130. The underfill 140 may protect the internal interconnection structures 115 and may mechanically connect the semiconductor dies 110A and 110B to the substrate 130. The underfill 140 may be applied to the semiconductor dies 110A and 110B and/or the substrate 130 before the semiconductor dies 110A and 110B and the substrate 130 are electrically connected. In some embodiments, the underfill 140 may fill a gap between each of the semiconductor dies 110A and 110B and the substrate 130 via capillary action after the semiconductor dies 110A and 110B and the substrate 130 are electrically connected. Additionally, the underfill 140 may comprise a non-conductive paste with or without an organic or inorganic filler.

The underfill 140 is configured such that the underfill 140 substantially adheres to the EMI shield layer 120. In particular, the underfill 140 may adhere to bottom and side surfaces of the second conductive layers 122 formed on the third surfaces of the semiconductor dies 110A and 110B. For embodiments in which the EMI shield layer 120 is formed by spin-coating, spraying, and/or printing, the EMI shield layer 120 may have a very rough, porous surface, compared to surfaces of the semiconductor dies 110A and 110B. Specifically, the EMI shield layer 120 may exhibit a much higher roughness than the semiconductor dies 110A and 110B. Therefore, since the underfill 140 having relatively high roughness is directly adhered to the EMI shield layer 120, adhesion between the underfill 140 and the EMI shield layer 120 is improved. Moreover, mechanical adhesion between the EMI shield layer 120/the semiconductor dies 110A and 110B and the substrate 130 may be improved by the underfill 140.

In some embodiments, the underfill 140 may not be provided. If a filler size of the encapsulating portion 150 (described in more detail below) is smaller than a size of the gap between a semiconductor dies 110A, 110B and the substrate 130, an encapsulating material may sufficiently inject into and fill the gap. In such embodiments, the underfill 140 may not be provided.

The encapsulating portion 150 (e.g., an encapsulating member or an encapsulant) may encapsulate the EMI shield layer 120, the underfill 140, and the substrate 130. The encapsulating portion 150 may protect the EMI shield layer 120, the underfill 140, and the substrate 130 from external circumstances. Examples of the encapsulating portion 150 as well as other encapsulating portions described herein may include, but are not limited to, an epoxy mold compound, an epoxy mold resin, and so on. The encapsulating portion 150 may entirely encapsulate the EMI shield layer 120 on the substrate 130. In some embodiments, the encapsulating portion 150 may expose a portion of the EMI shield layer 120. For example, the encapsulating portion 150 may not be formed on the first conductive layer 121 of the EMI shield layer 120. As such, the first conductive layer 121 of the EMI shield layer 120 may be directly exposed to the outside. More specifically, a top surface of the first conductive layer 121 of the EMI shield layer 120 may be coplanar with a top surface of the encapsulating portion 150. In such embodiment, the semiconductor dies 110A and 110B may have more increased heat radiating performance.

If the encapsulating portion 150 entirely encapsulates the EMI shield layer 120, high adhesion between the encapsulating portion 150 and the EMI shield layer 120 may result. As such, interfacial delamination between the encapsulating portion 150 and the EMI shield layer 120 may be eliminated. In particular, since the roughness of the EMI shield layer 120 is high, as described above, the adhesion demonstrated between the encapsulating portion 150 and the EMI shield layer 120 is further increased. Moreover, if the encapsulating portion 150 entirely encapsulates the EMI shield layer 120, the encapsulating portion 150 may protect the EMI shield layer 120 from external physical and chemical shocks.

Examples of the external interconnection structures 160 may include, but are not limited to, metal pillars, solder bumps, solder balls, bumps or lands. The external interconnection structures 160 may include bumps having a size of approximately 100-200 μm or bumps/pillars having a size of approximately 20-100 μm. When solder bumps are used in the external interconnection structures 160, the external interconnection structures 160 may include one or more solder metals melted at a lower temperature than other metals and may provide physical and electrical bonding between the external interconnection structures 160 and an external circuit board or another device during melting and cooling processes. Examples of the external interconnection structures 160 may include, but are not limited to, a ball grid array (BGA) and/or a land grid array (LGA). While solder balls used in the external interconnection structures 160 are illustrated, the external interconnection structures 160 may include various types of structures.

As described above, according to various embodiments of the present disclosure, the EMI shield layer 120 is directly formed on the first surface 111 (e.g., top surface) and/or the third surface 113 (e.g., side surface) of the semiconductor dies 110A and 110B. Such forming of the EMI shield layer 120 may improve the productivity and yield of the EMI shield layer 120 and may provide the semiconductor device 100 with improved EMI shielding efficiency. In addition, since the EMI shield layer 120 is embedded into the encapsulating portion 150, the semiconductor device 100 may be safely protected from external circumstances. Furthermore, such forming of the EMI shield layer 120 may aid in miniaturizing and slimming of the semiconductor device 100.

Figure 2A:
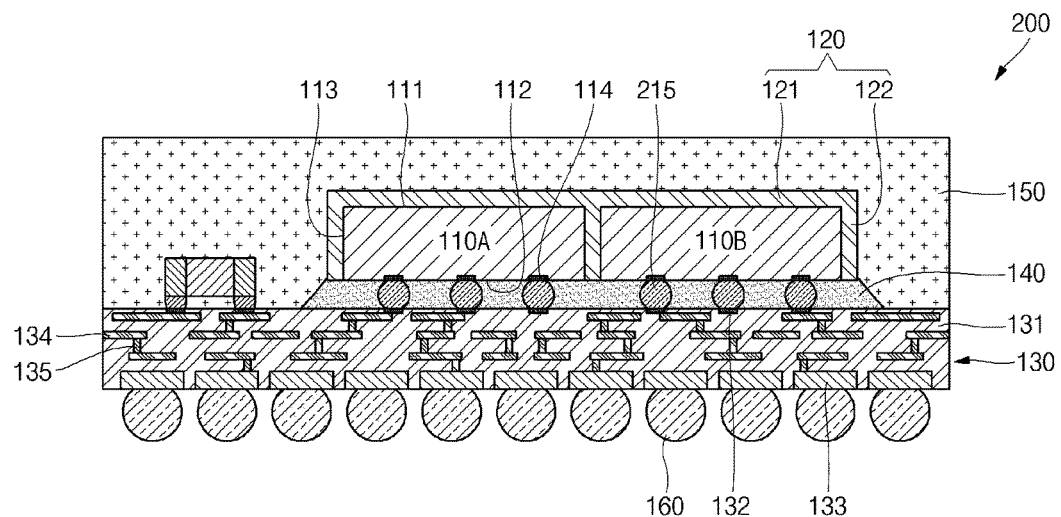
FIGS. 2A and 2B are cross-sectional views of a semiconductor device according to various example embodiments of the present disclosure and semiconductor dies each having an EMI shield layer.
Figure 2B:
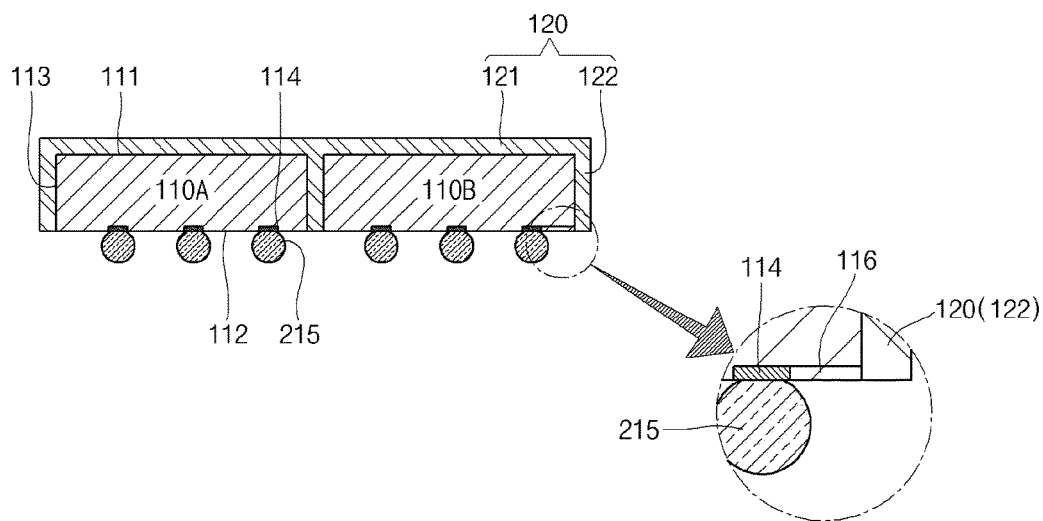

Referring to FIGS. 2A and 2B, cross-sectional views of a semiconductor device 200 according to various example embodiments of the present disclosure are illustrated. As illustrated, the semiconductor device 200 may be formed in a similar manner to the semiconductor device 100. However, the semiconductor device 200 may include internal interconnection structures 215 comprising conductive balls that connect the semiconductor dies 110A and 110B to the substrate 130. In comparison, the internal interconnection structures 115 of the semiconductor device 100 illustrated in FIGS. 1A and 1B include conductive pillars having solders (e.g., copper pillars).

The internal interconnection structures 215, such as solder balls, may electrically connect the semiconductor dies 110A and 110B to the substrate 130 by mass reflowing, which may improve the productivity of the semiconductor device 200. In addition, the interconnection structures 215, such as solder balls, may be formed in a more simplified manner than other internal interconnection structures such as conductive pillars. As such, the interconnection structures 215 may be formed at low cost than the interconnection structures 115, thus reducing manufacturing costs of the semiconductor device 200 in comparison to the semiconductor device 100.

Figure 3A:
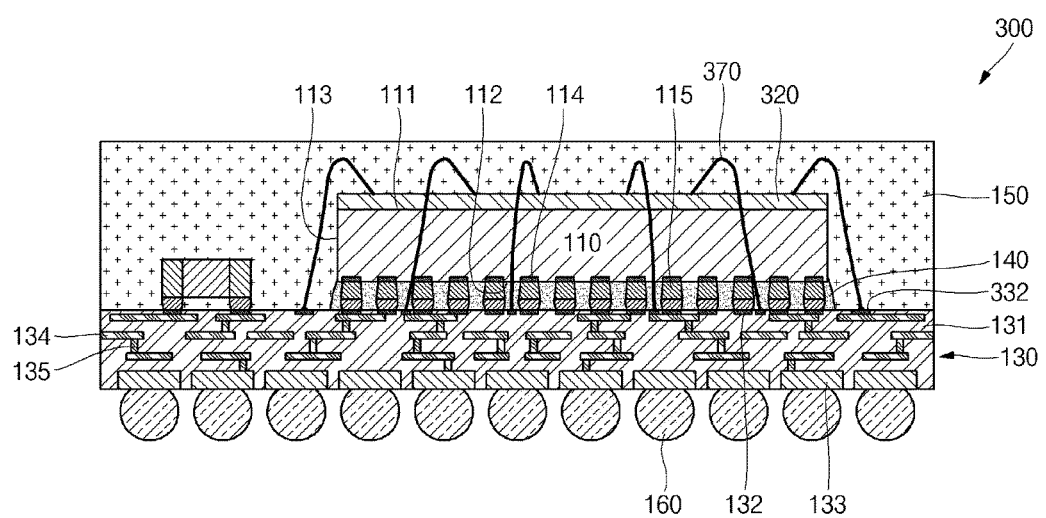
FIGS. 3A and 3B are cross-sectional views of a semiconductor device according to various example embodiments of the present disclosure and a semiconductor die having an EMI shield layer.
Figure 3B:
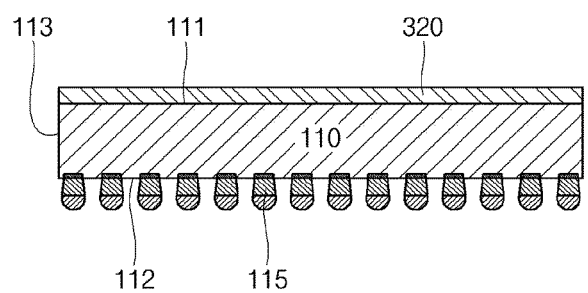
Figure 3C:
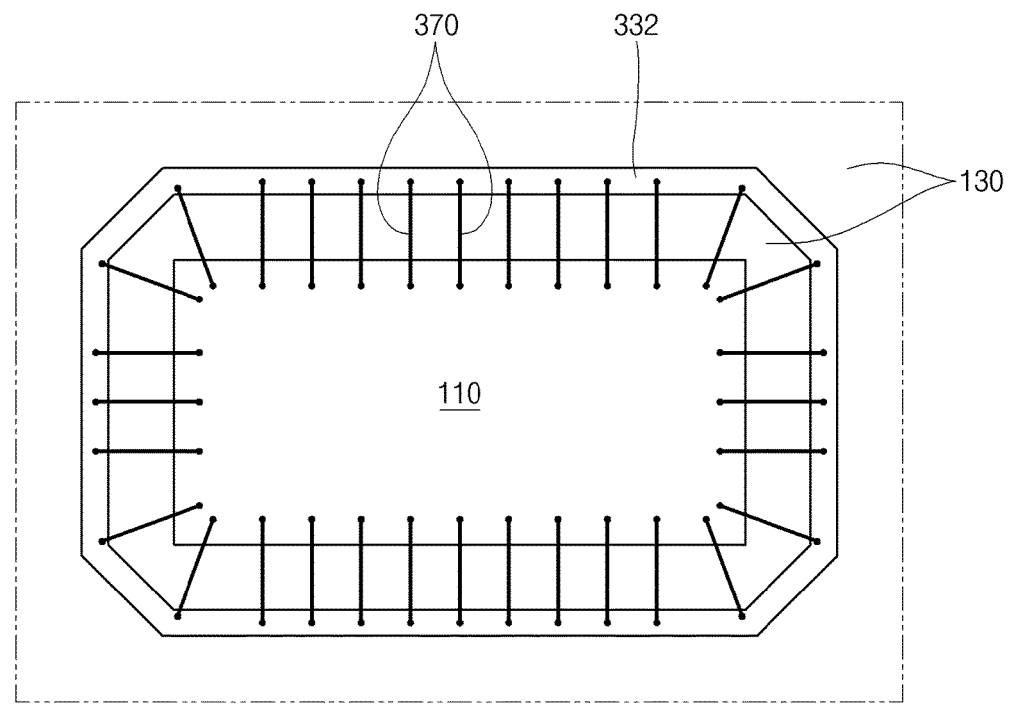
FIG. 3C is a plan view of the EMI shield layer and wires.

FIGS. 3A and 3B depicts cross-sectional views of a semiconductor device 300 and a semiconductor die 110 having an EMI shield layer 320 according to various example embodiments of the present disclosure. FIG. 3C provides a plan view of the EMI shield layer 320 and wires 370.

As illustrated in FIGS. 3A-3C, the semiconductor device 300, according to various example embodiments of the present disclosure, may include a semiconductor die 110, an EMI shield layer 320 formed only on first surfaces 111 (e.g., top surfaces) of the semiconductor die 110, and a plurality of EMI shielding wires 370 electrically connecting the EMI shield layer 320 to the substrate 130. In particular, the EMI shield layer 320 may be formed only on the first surface 111 of the semiconductor die 110 but not on third surfaces 113 of the semiconductor die 110. Therefore, the encapsulating portion 150 may be directly adhered to the EMI shield layer 320 formed on the first surface 111 of the semiconductor die 110 and to the third surfaces 113 of the semiconductor die 110.

In addition, the EMI shielding wires 370 may electrically connect the EMI shield layer 320 to a ground circuit pattern 332 of the substrate 130. In particular, the EMI shielding wires 370 may be substantially parallel with the third surfaces 113 of the semiconductor dies 110. To this end, first ends of the EMI shielding wires 370 may be ball-bonded (or stitch-bonded) to the EMI shield layer 320 and second ends of the EMI shielding wires 370 may be stitch-bonded (or ball-bonded) to the ground circuit pattern 332.

A planar shape of the EMI shield layer 320 may be, but is not limited to, a generally rectangular shape having four sides. A planar shape of the ground circuit pattern 332 of the substrate 130 may also be a generally rectangular shape having four sides. The EMI shielding wires 370 may be arranged at a constant pitch along the four sides of the EMI shield layer 320. Each of the EMI shielding wires 370 may electrically connect one side of the EMI shield layer 320 to a corresponding side of the ground circuit pattern 332.

The EMI shielding wires 370 may be spaced a predetermined distance apart from the third surfaces 113 of the semiconductor dies 110 and may shield the semiconductor die 110. The distance or pitch between the EMI shielding wires 370 may vary according to wavelength range of electromagnetic waves to be shielded. For example, the shorter the wavelength of electromagnetic waves to be shielded, the smaller the distance or pitch between the EMI shielding wires 370. Examples of materials, from which to construct the EMI shielding wires 370, may include, but are not limited to, various metals, such as gold (Au), silver (Ag), copper (Cu), or aluminum (Al).

The encapsulating portion 150 may encapsulate and protect the semiconductor die 110, the EMI shield layer 320, and the EMI shielding wires 370 on the substrate 130 from external physical and chemical circumstances. In turn, the EMI shield layer 320 and the EMI shielding wires 370 may inductively shield the semiconductor die 110 from electromagnetic waves.

As described above, according to various embodiments of the present disclosure, the EMI shield layer 320 and EMI shielding wires 370 form a Faraday cage around the semiconductor die 110. Such Faraday cage may prevent electromagnetic waves generated from the semiconductor die 110 from being radiated to the outside. Moreover, the Faraday cage may prevent external electromagnetic waves from entering and interfering with the semiconductor die 110.

Figure 4A:
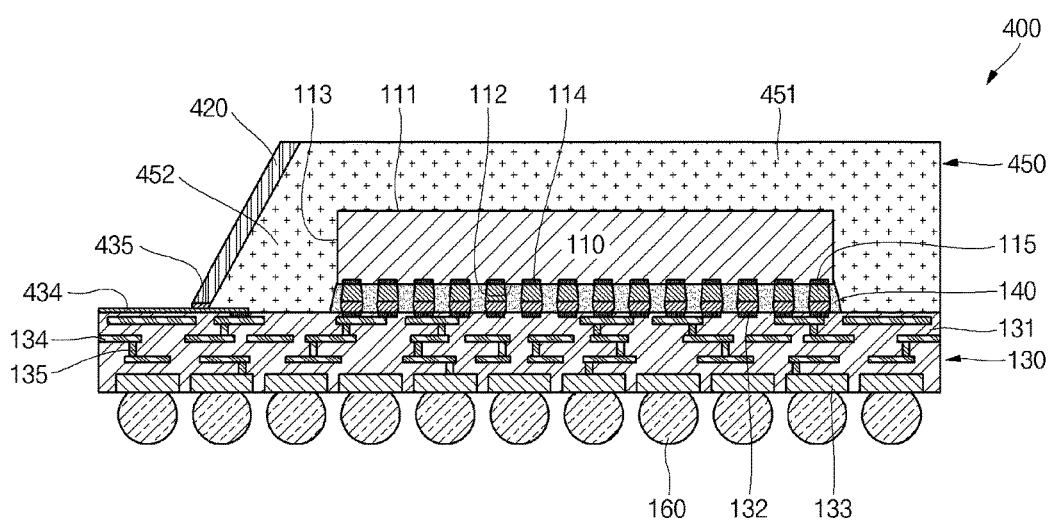
FIGS. 4A and 4B are a cross-sectional view and a side view of a semiconductor device according to various example embodiments of the present disclosure.
Figure 4B:
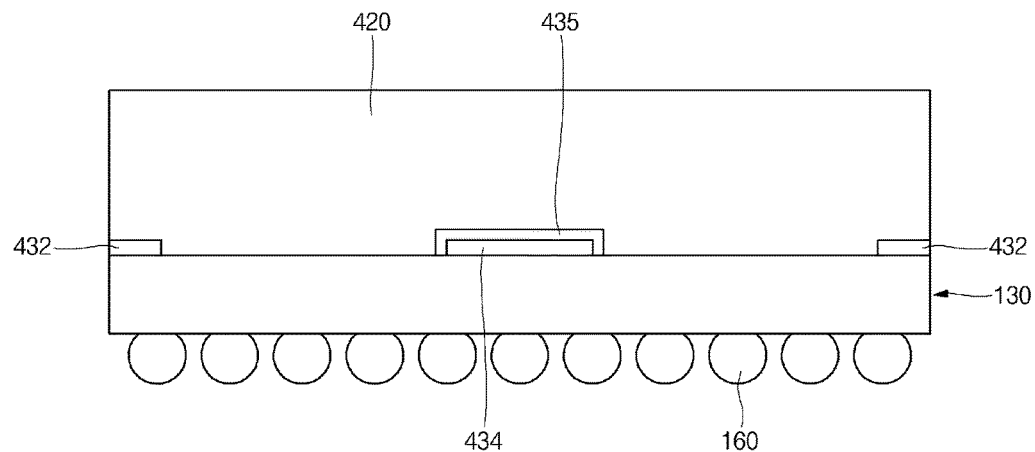

Referring to FIGS. 4A and 4B, a cross-sectional view and a side view of a semiconductor device 400 according to various example embodiments of the present disclosure are illustrated. As illustrated in FIGS. 4A and 4B, the semiconductor device 400 may include a semiconductor die 110, a substrate 130, an encapsulating portion 450, and an EMI shield layer 420. The encapsulating portion 450 may include a first region 451 encapsulating roughly the first surface 111 of the semiconductor die 110 and a second region 452 encapsulating roughly third surfaces 113 of the semiconductor dies 110.

The EMI shield layer 420 may shield the first region 451 of the encapsulating portion 450 and at least a portion of the second region 452. As illustrated, the EMI shield layer 420 may shield the second region 452 of the encapsulating portion 450, but aspects of the present disclosure are not limited thereto. Rather, the EMI shield layer 420 may shield the first region 451 of the encapsulating portion 450.

The substrate 130 may further include an antenna pattern 434 formed on a top surface thereof. If the antenna pattern 434 is encapsulated by the EMI shield layer 420, the EMI shield layer would prevent or substantially reduce the antenna pattern 434 from functioning as an antenna. Therefore, the antenna pattern 434, as shown, may be exposed from the EMI shield layer 420 and/or the encapsulating portion 450.

To this end, the EMI shield layer 420 may be formed on, for example, the second region 452 of the encapsulating portion 450, but not formed on, for example, the antenna pattern 434. An insulation layer 435 may be interposed between the EMI shield layer 420 and the antenna pattern 434. Alternatively, the EMI shield layer 420 and the antenna pattern 434 may be spaced a predetermined distance apart from each other. In addition, the EMI shield layer 420 may be electrically connected to the ground circuit pattern 432 formed on the substrate 130. Since the EMI shield layer 420 is formed on a region spaced apart from the antenna pattern 434 (e.g., the second region 452 of the encapsulating portion 450), the EMI shield layer 420 may efficiently shield electromagnetic waves from semiconductor die 110 while not impeding the operation of the antenna pattern 434 formed on the substrate 130.

Figure 5:
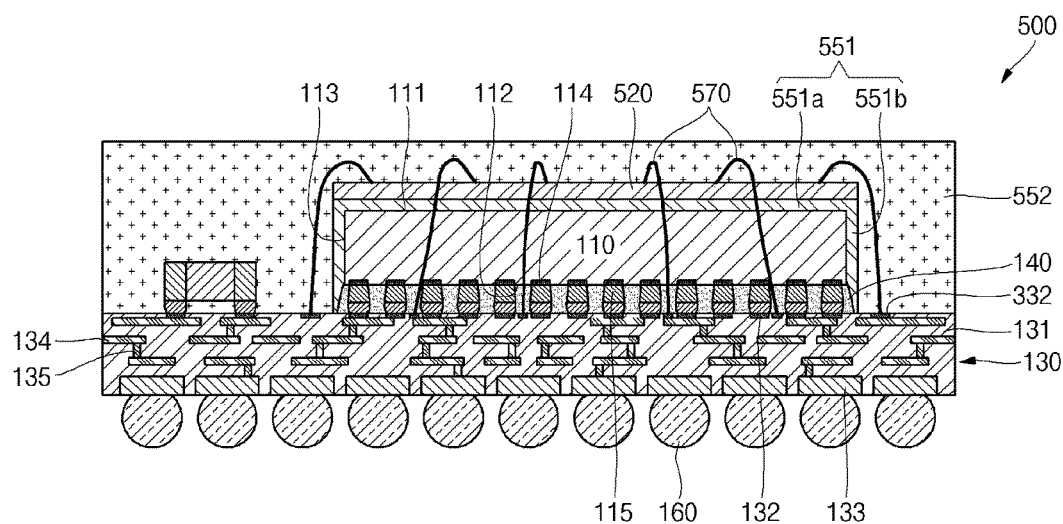
FIG. 5 is a cross-sectional view of a semiconductor device according to various example embodiments of the present disclosure.

Referring to FIG. 5, a cross-sectional view of a semiconductor device 500 according to various example embodiments of the present disclosure is illustrated. As illustrated in FIG. 5, the semiconductor device 500 may include a semiconductor die 110, a substrate 130, a first encapsulating portion 551 encapsulating the semiconductor die 110, an EMI shield layer 520 formed on the first encapsulating portion 551, EMI shielding wires 570 connecting the EMI shield layer 520 to the substrate 130, and a second encapsulating portion 552 encapsulating the first encapsulating portion 551, the EMI shield layer 520, and the EMI shielding wires 570.

The first encapsulating portion 551 may encapsulate a first surface 111 and third surfaces 113 of the semiconductor die 110. A first region 551a of the first encapsulating portion 551 may encapsulate the first surfaces 111 of the semiconductor die 110. The second region 551b of the first encapsulating portion 551 may encapsulate the third surface 113 of the encapsulating portion 551.

The EMI shield layer 520 may be formed on the first region 551a of the first encapsulating portion 551. In particular, the EMI shield layer 520 may be formed on the first region 551a of the first encapsulating portion 551 corresponding to the first surface 111 of the semiconductor die 110. The first region 551a of the first encapsulating portion 551 may be formed to be substantially planar. The EMI shield layer 520 may also be formed to have a substantially planar plate.

The EMI shielding wires 570 may electrically connect the EMI shield layer 520 to the ground circuit pattern 332 provided on the substrate 130. In an example, the EMI shielding wires 570 may be formed to be substantially parallel with the second region 551b of the first encapsulating portion 551. In addition, the EMI shielding wires 570 may be spaced a predetermined distance apart from the second region 551b of the first encapsulating portion 551. In particular, the EMI shielding wires 570 may be formed to shield the first encapsulating portion 551 (e.g., third surfaces of the semiconductor dies 110).

The second encapsulating portion 552 may encapsulate the first encapsulating portion 551, the EMI shield layer 520, and the EMI shielding wires 570. Examples of the second encapsulating portion 552 may include, but are not limited to, the same or different material from that of the first encapsulating portion 551. In some embodiments, the second encapsulating portion 552 may have a smaller modulus than the first encapsulating portion 551. Therefore, the second encapsulating portion 552 may efficiently absorb or relieve external shocks, compared to the first encapsulating portion 551.

As described above, the semiconductor dies 110 is encapsulated by the first encapsulating portion 551. The EMI shield layer 520 is formed on a surface of the first encapsulating portion 551, thereby protecting the semiconductor die 110 from external circumstances. The EMI shield layer 520 may further provide the semiconductor device 500 with improved EMI shielding efficiency. Since the semiconductor die 110 is encapsulated by both the first encapsulating portion 551 and the plurality of EMI shielding wires 570, the semiconductor device 500 has improved EMI shielding efficiency.

In some embodiments, the second encapsulating portion 552 may be omitted. In such embodiments, the EMI shield layer 520 and the EMI shielding wires 570 may be exposed to the outside. Further, a portion of the first encapsulating portion 551 not covered by the EMI shield layer 520, a portion of the substrate 130 not covered by the first encapsulating portion 552, and the passive device may be exposed to the outside. However, the EMI shield layer 520 and EMI shielding wires 570 still form a Faraday cage around the semiconductor die 110. As described above, the Faraday cage may prevent electromagnetic waves generated from the semiconductor die 110 from being radiated to the outside and may prevent external electromagnetic waves from entering and interfering with the semiconductor die 110.

Figure 6:
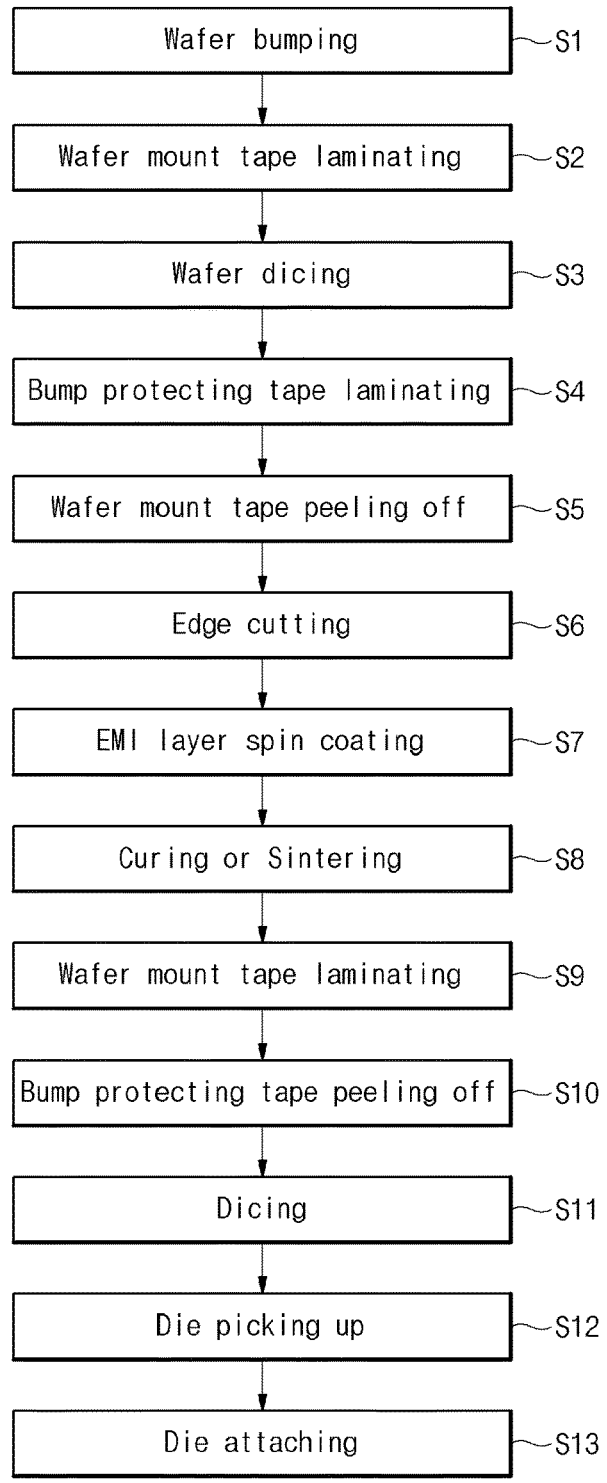
FIG. 6 is a flowchart of a manufacturing method of a semiconductor device according to various example embodiments of the present disclosure.

Referring to FIG. 6, a flowchart of a manufacturing method of a semiconductor device according to various example embodiments of the present disclosure is illustrated. As illustrated, the manufacturing method may include a wafer bumping step (S1) of forming interconnection structures on a front side of a wafer (e.g., second surfaces of semiconductor dies) and a wafer mount tape laminating step (S2) of laminating a wafer mount tape on a back side (e.g., a first surface) of the wafer. The method may further include a wafer dicing step (S3) of separating the wafer into individual semiconductor dies along street lines, and a bump protecting tape laminating step (S4) of laminating a bump protecting tape on the front side of the wafer.

The method may also include a wafer mount tape peeling-off step (S5) of peeling off the wafer mount tape from the wafer, and an edge cutting step (S6) of cutting the edge of the bump protecting tape and removing the same. Further yet, the method may include an EMI shield layer spin-coating step (S7) of spin-coating an EMI shield layer on the back side of the wafer, and a curing or sintering step (S8) of curing or sintering the coated EMI shield layer.

The method may further include a wafer mount tape laminating step (S9) of laminating the cured or sintered wafer mount tape on the back side of the wafer, and a bump protecting tape peeling-off step (S10) of peeling off the bump protecting tape from the front side of the wafer. Moreover, the method may include a dicing step (S11) of separating from the wafer into individual semiconductor dies or a plurality of semiconductor dies, and a die picking-up step (S12) of picking up the separated semiconductor dies using a pickup tool. The method may also include a die attaching step (S13) of attaching the semiconductor dies to a substrate.

Referring to FIGS. 7A-7M, cross-sectional views sequentially illustrating process steps of a manufacturing method of a semiconductor device according to various example embodiments of the present disclosure are illustrated. In particular, the manufacturing method is described in reference to the semiconductor device 100, FIGS. 1A, 1B, 6, and 7A-7M.

Figure 7A:
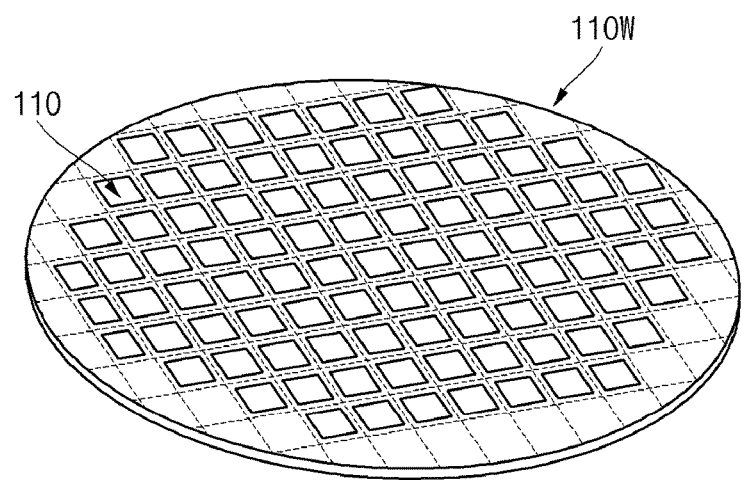
FIGS. 7A-7M are cross-sectional views sequentially illustrating process steps of a manufacturing method of a semiconductor device according to various example embodiments of the present disclosure.

As illustrated in FIG. 7A, in the wafer bumping step (S1), a plurality of internal interconnection structures 115 are formed on the front side of a wafer 110W. In particular, the plurality of internal interconnection structures 115 may be formed on front sides (e.g., second surfaces 112) of individual semiconductor dies 110 that are formed on the wafer 110W. Examples of the various types of internal interconnection structures 115 may include, but are not limited to, micro bumps, metal pillars, solder bumps, solder balls, etc.

Figure 7B:
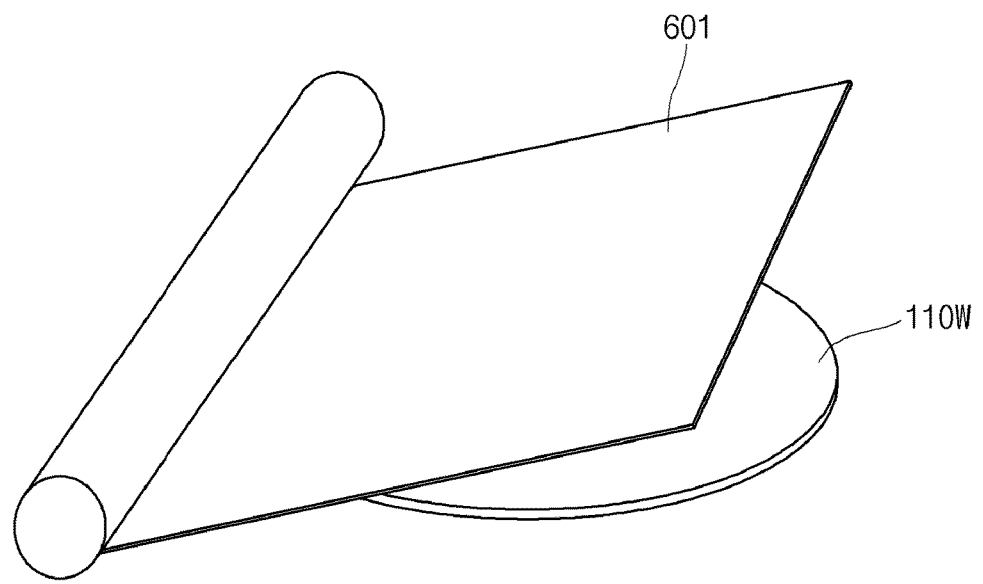

As illustrated in FIG. 7B, in the wafer mount tape laminating step (S2), a wafer mount tape 601 may be mounted on a back side of the wafer 110W. In particular, the wafer mount tape 601 may be mounted on first surfaces 111 of the semiconductor dies 110 that are formed on the wafer 110W. Although not illustrated, the wafer mount tape 601 may supported by a substantially circular mount ring. More specifically, the back side of the wafer 110W may be temporarily adhered to the wafer mount tape 601 supported by the circular mount ring.

Figure 7C:
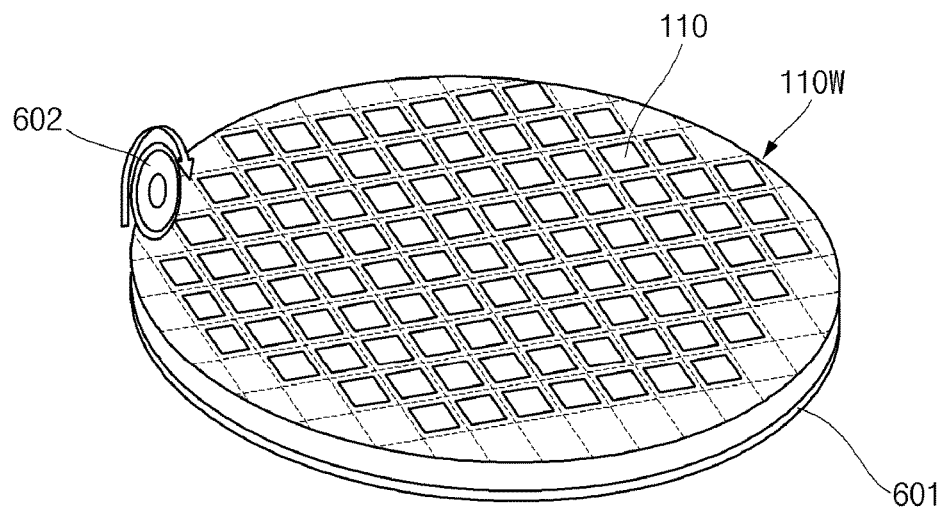

As illustrated in FIG. 7C, in the wafer dicing step (S3), the individual semiconductor dies 110 may be separated along the street lines formed on the wafer 110W using a dicing tool 602 such as, for example, a diamond blade, diamond wheel, or a laser beam. Therefore, the individual semiconductor dies 110 formed on the wafer 110W may be spaced a predetermined distance apart from each other due to such wafer dicing. Moreover, the wafer dicing may maintain the individual semiconductor dies 110 in a state in which the semiconductor dies 110 are still adhered to the wafer mount tape 601.

Figure 7D:
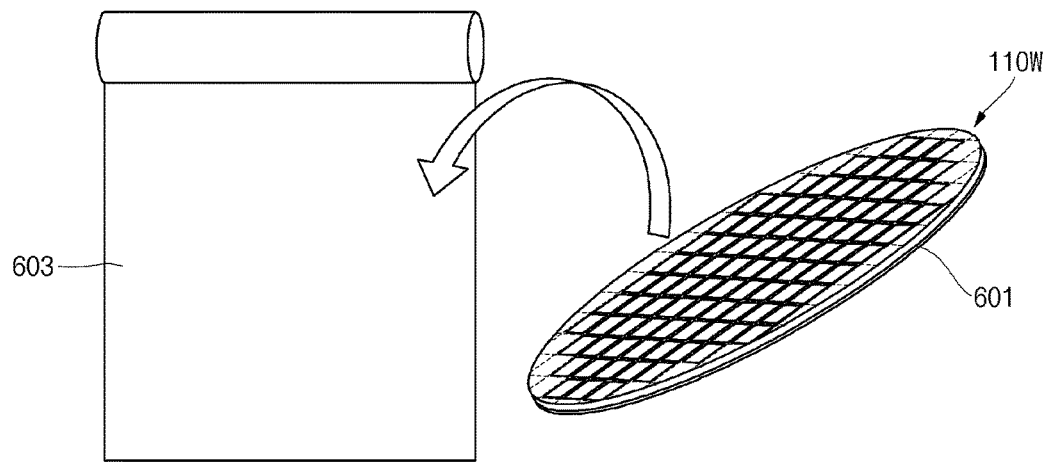

As illustrated in FIG. 7D, in the bump protecting tape laminating step (S4), a bump protecting tape 603 may be laminated on the wafer 110W including the plurality of semiconductor dies 110 spaced apart from each other. In particular, the bump protecting tape 603 may be temporarily adhered to the front side of the wafer 110W. The internal interconnection structures 115 formed on the front side of the wafer 110W may be protected by the bump protecting tape 603 during a manufacturing process.

Figure 7E:
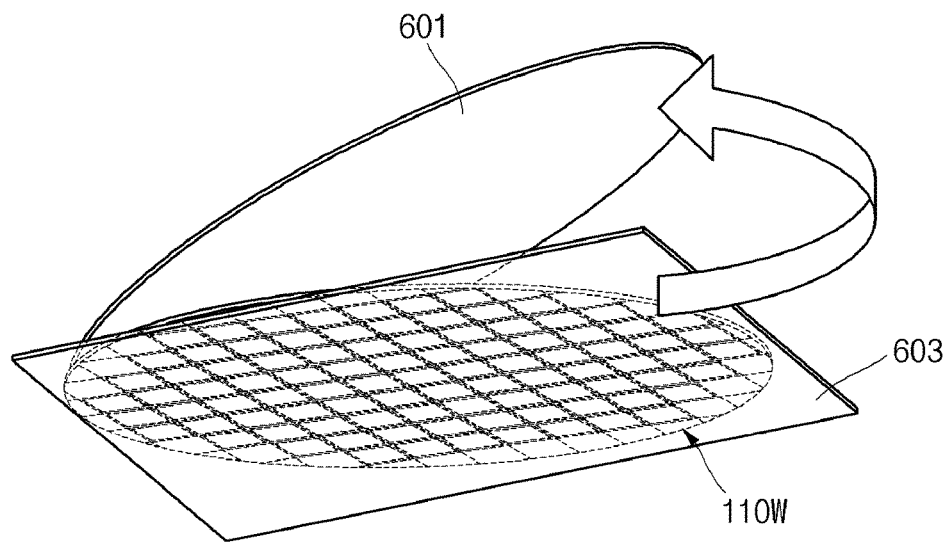

As illustrated in FIG. 7E, in the wafer mount tape peeling-off step (S5), the wafer mount tape 601 adhered to the back side of the wafer 110W may be peeled off. Accordingly, the back side of the wafer 110W may be exposed to the outside. In particular, the wafer mount peeling-off step may expose the first surface 111 and the third surface 113 of each of the separated individual plurality of semiconductor dies 110 to the outside. However, the wafer mount tape peeling-off step may maintain the semiconductor dies 110 or the front side (e.g. second surface 112) of the wafer 110W in a state in which the semiconductor dies 110 remain adhered to the bump protecting tape 603.

Figure 7F:
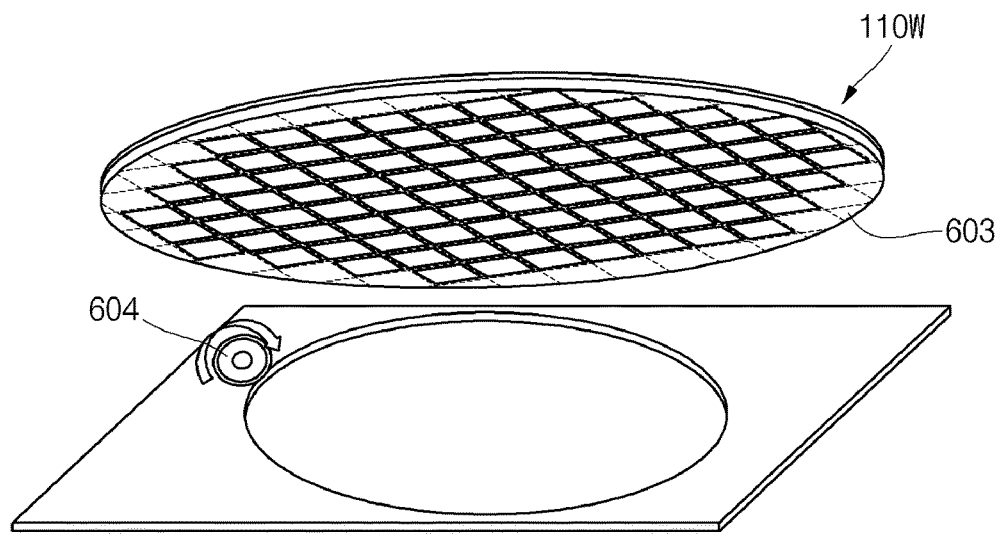

As illustrated in FIG. 7F, in the edge cutting step (S6), an edge cutting tool 604 may cut a circumferential edge of the bump protecting tape 603 corresponding to that of the wafer 110W. In this manner, the excess bump protecting tape 603 that extends beyond the circumferential edge of the wafer 110 is thus removed by the edge cutting tool 604. Accordingly, the wafer 110W and the bump protecting tape 603 may have the same planar shape after the edge cutting step (S6).

Figure 7G:
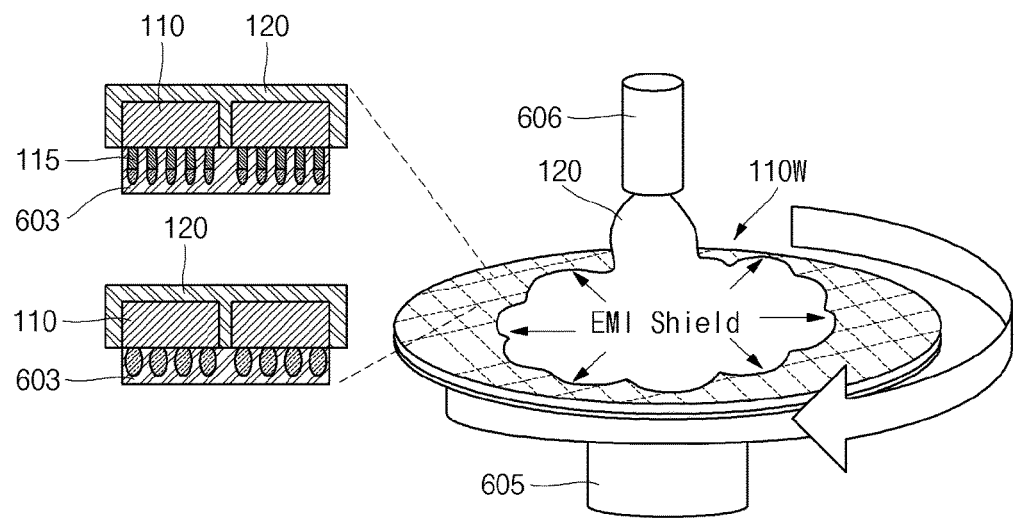

As illustrated in FIG. 7G, in the EMI shield layer spin-coating step (S7), the wafer 110W may be mounted via the bump protecting tape 603 on a spin coating apparatus 605. The EMI shield layer 120 may then be spin-coated on the back side of the wafer 110W by a coating tool 606. Accordingly, spin coating apparatus 602 may coat the EMI shield layer 120 not only on the top surface (e.g., the first surfaces 111) of the semiconductor dies 110 but also on side surfaces (e.g., the third surfaces 113) of the semiconductor dies 110. To this end, the spin coating apparatus 605 may use a highly-viscous coating solution or slurry that includes metal particles, a binder for binding the metal particles, and a solvent. After the highly viscous slurry for the EMI shield layer 120 is coated on the back side of the wafer 110W, the spin coating apparatus 605 may rotate the wafer 110W at a high speed, so that the EMI shield layer 120 is uniformly distributed on the first and third surfaces 111 and 113 of the semiconductor dies 110. In some embodiments, the EMI shield layer 120 may be formed from, for example, a conductive polymer, a conductive ink, or a conductive paste.

Figure 7H:
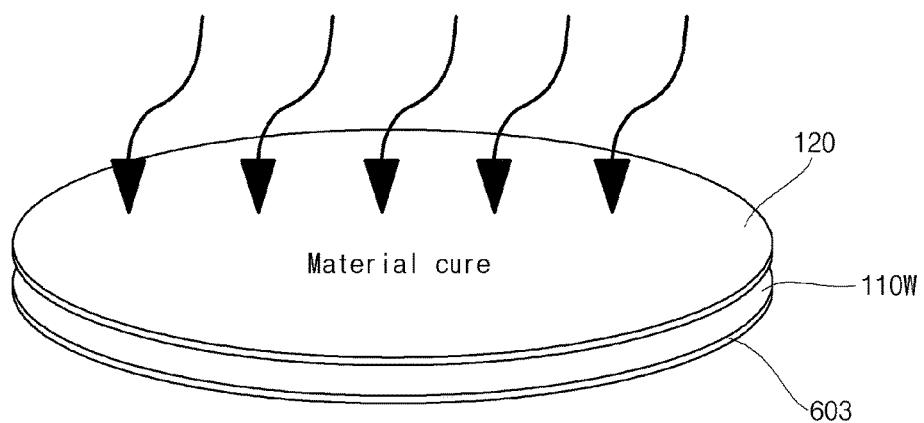

As illustrated in FIG. 7H, in the curing or sintering step (S8), the EMI shield layer 120 formed on the back side of the wafer 110W may be cured and/or sintered by heat and/or light. For example, when the EMI shield layer 120 is made of a heat-curable material, heat may be applied to the EMI shield layer 120, and/or when the EMI shield layer 120 is made of a photo-curable material, light may be applied to the EMI shield layer 120. The solution contained in the slurry may be completely volatilized and removed by the curing and/or sintering process. As a result, only the conductive metal or the conductive polymer and the binder may remain in the EMI shield layer 120.

Figure 7I:
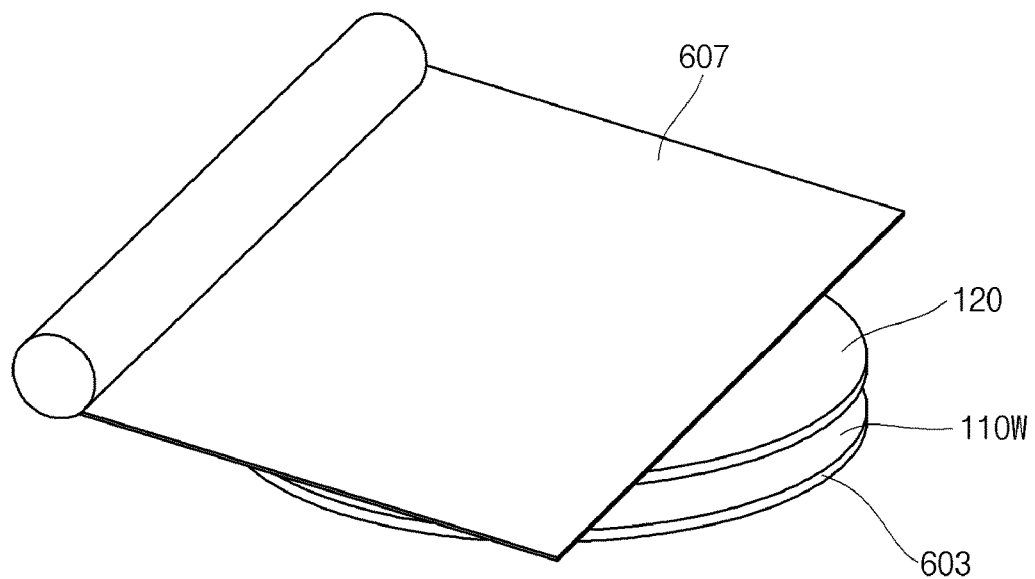

As illustrated in FIG. 7I, in the wafer mount tape laminating step (S9), a wafer mount tape 607 may again be laminated on a surface of the cured and/or sintered EMI shield layer 120.

Figure 7J:
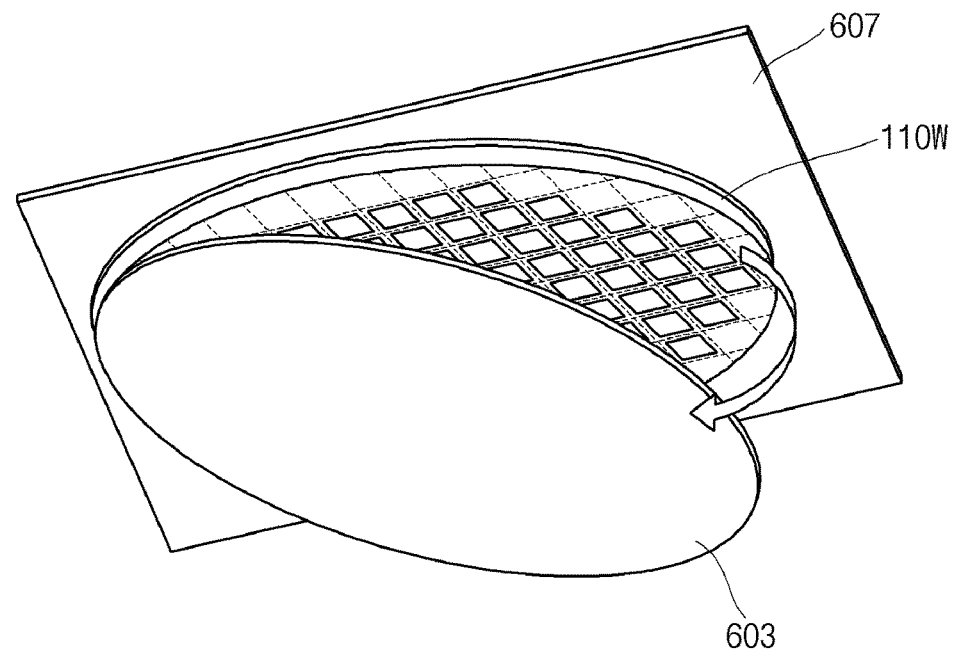

As illustrated in FIG. 7J, in the bump protecting tape peeling-off step (S10), the bump protecting tape 603 adhered to the front side (e.g., the second surfaces 112) of the wafer 110W may be peeled-off. Accordingly, the front side of the wafer 110W and the internal interconnection structures 115 may be exposed to the outside.

Figure 7K:
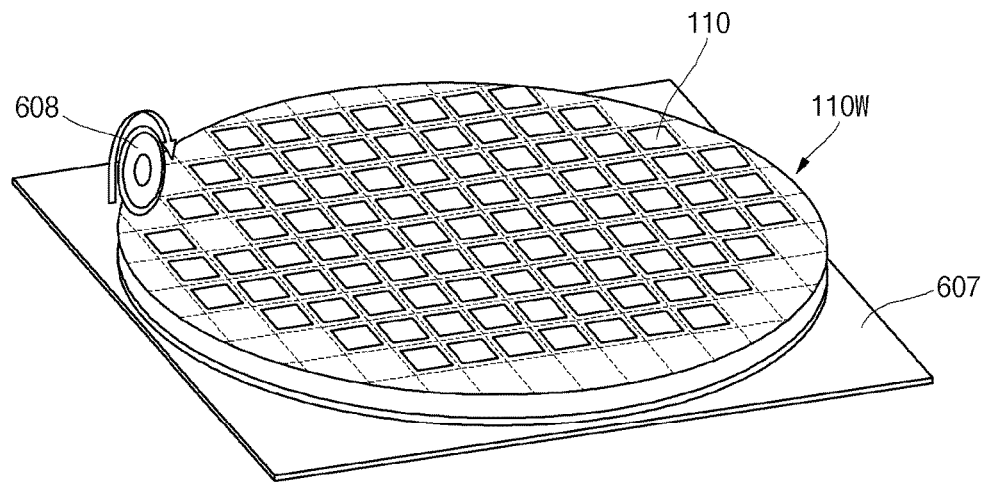

As illustrated in FIG. 7K, in the dicing step (S11), the individual semiconductor dies 110 or the plurality of semiconductor dies 110 are separated from the wafer 110W by a dicing tool 608, such as a diamond wheel or a laser beam. The dicing tool 608 may saw the EMI shield layer 120 formed between each of the semiconductor dies 110 and its adjacent semiconductor die 110. Accordingly, single semiconductor die(s) 110 may be separated or groups of semiconductor dies may be separated from the wafer 110W. A width of the dicing tool 608 may be smaller than a thickness or width of the EMI shield layer 120 formed in a gap between each of the semiconductor dies 110 and its adjacent semiconductor die 110. As such, the EMI shield layer 120 may remain on the side surfaces (e.g., the third surfaces 113) of the semiconductor dies 110 even after the dicing. The thickness of the EMI shield layer 120 remaining on the third surfaces 113 of the semiconductor dies 110 may be in the range of, for example, approximately 0.1 µm to approximately 1000 µm, or in the more narrow range of 1 µm to 100 µm, or in the even more narrow range of 10 µm to 30 µm, but aspects of the present disclosure are not limited thereto.

Figure 7L:
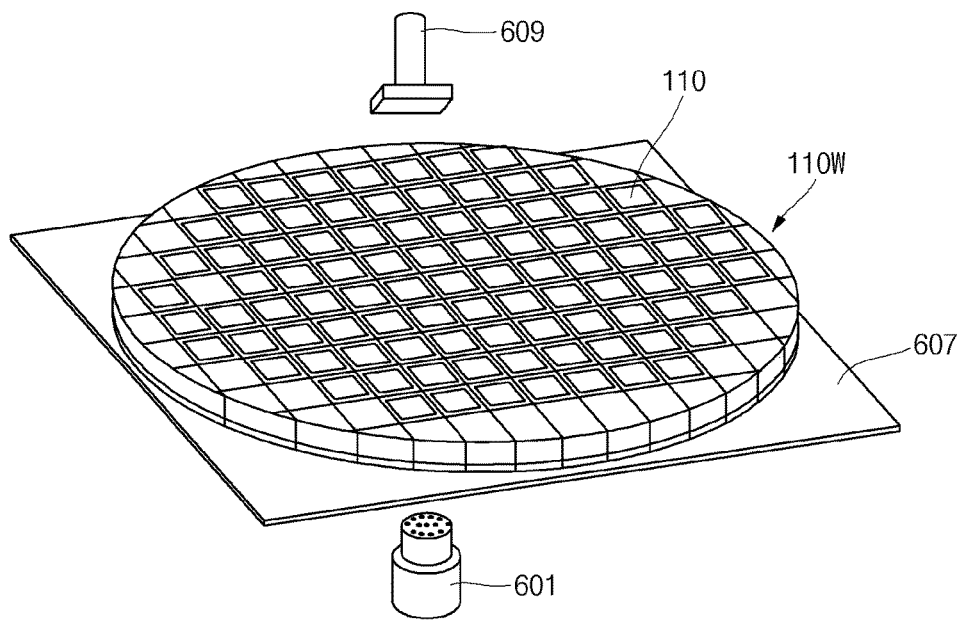

As illustrated in FIG. 7L, in the die pickup step (S12), an eject pin 610 may upwardly push a pertinent semiconductor die 110. A pickup tool 609 may pick up and remove the pertinent semiconductor die 110 from the wafer mount tape 607. The pickup tool 609 may further move the pertinent semiconductor die 110 to a predetermined position.

Figure 7M:
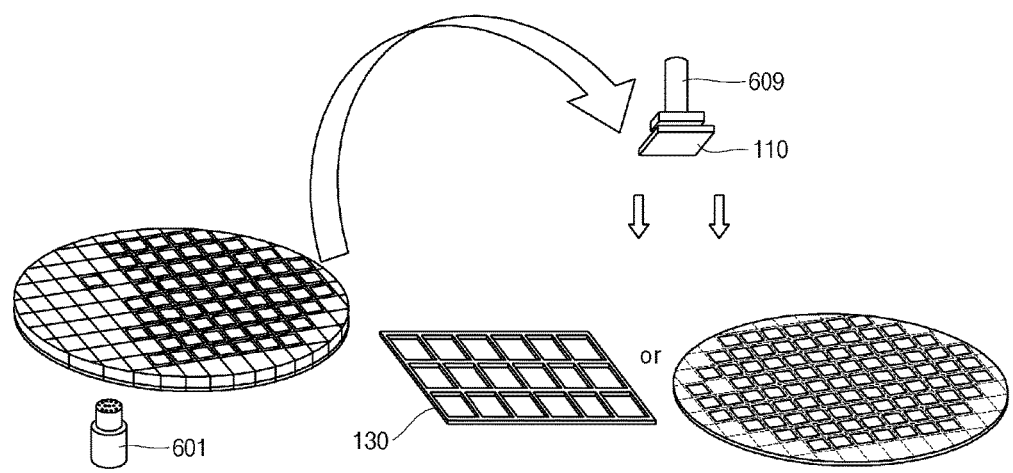

As illustrated in FIG. 7M, in the die attaching step (S13), the pickup tool 609 may transfer good-quality semiconductor dies 110 having the EMI shield layer 120 to a rectangular substrate 130 or separate wafer tray. The semiconductor dies 110 placed on the substrate 130 may be electrically connected to the substrate 130 by mass reflowing or thermal compression. Thereafter, an underfilling step, an encapsulating step, and an external interconnection structure forming step are sequentially performed.

As described above, the manufacturing method of the semiconductor device 100 according to the example embodiment of the present disclosure allows the semiconductor dies 110 having the EMI shield layer 120 to be rapidly mass-produced at low costs in large scales. Therefore, according to the embodiment of the present disclosure, the semiconductor dies 110 having the EMI shield layer 120 may be produced at low costs in high yield/high productivity. Moreover, since the EMI shield layer 120 is directly formed on surfaces of the semiconductor dies 110, the semiconductor device 100 may have high EMI shielding efficiency with improved miniaturization and slimness. Further, since the EMI shield layer 120 is embedded into the encapsulating portion 150, the semiconductor device 100 may be protected from external circumstances.

Referring to FIGS. 8A-8J, cross-sectional views sequentially illustrating process steps of a manufacturing method of a semiconductor device according to various example embodiments of the present disclosure are illustrated. In particular, the manufacturing method is described with reference to the semiconductor device 300, FIGS. 3A-3C, and FIGS. 8A-8J.

Figure 8A:
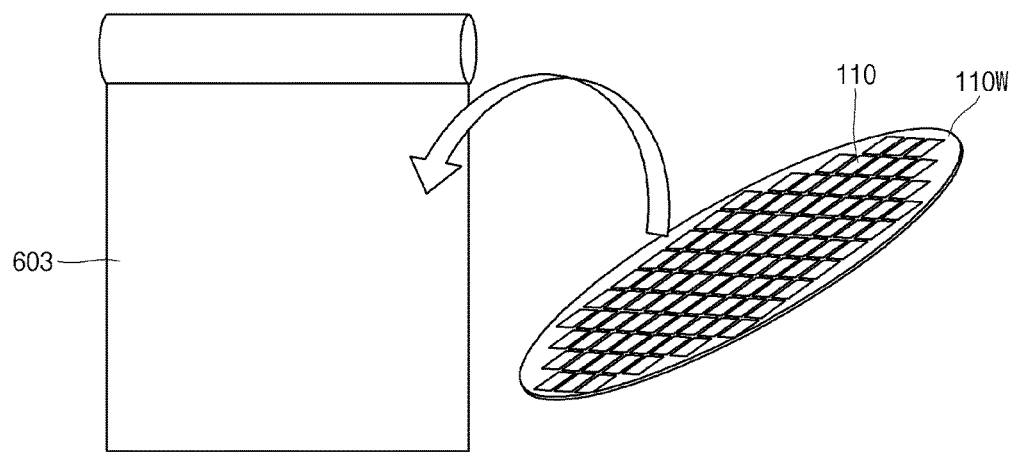
FIGS. 8A-8J are cross-sectional views sequentially illustrating process steps of a manufacturing method of a semiconductor device according to various example embodiments of the present disclosure.

As illustrated in FIG. 8A, a bump protecting tape 603 may be laminated on a front side (e.g., second surfaces 112) of a bumped wafer 110W. The back side (e.g., first surfaces 111) of the wafer 110W may remain exposed to the outside.

Figure 8B:
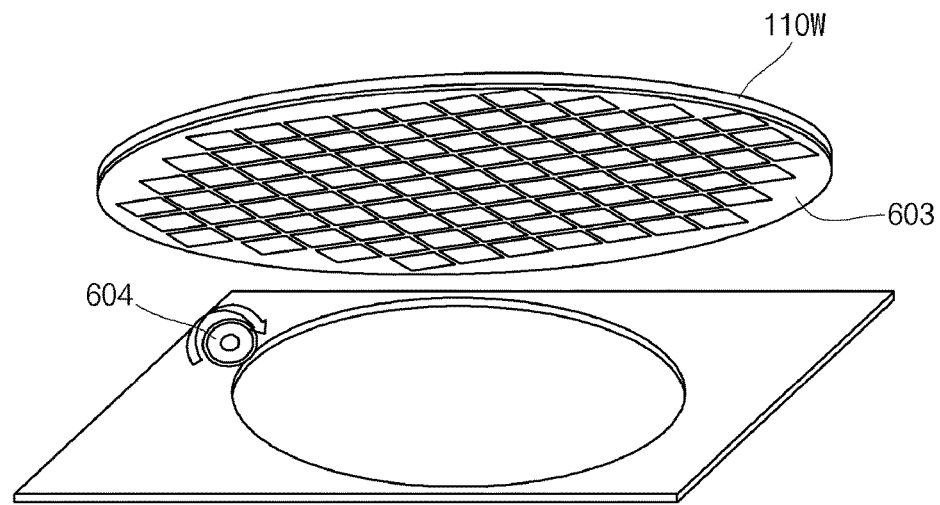

As illustrated in FIG. 8B, an edge cutting tool 604 may cut a region of the bump protecting tape 603 corresponding to a circumferential edge of the wafer 110W. As such, the bump protecting tape 603 extending beyond the circumferential edge of the wafer 110W may be removed by an edge cutting tool 604. After such cutting and removing, the wafer 110W and the bump protecting tape 603 may have substantially the same planar shape.

Figure 8C:
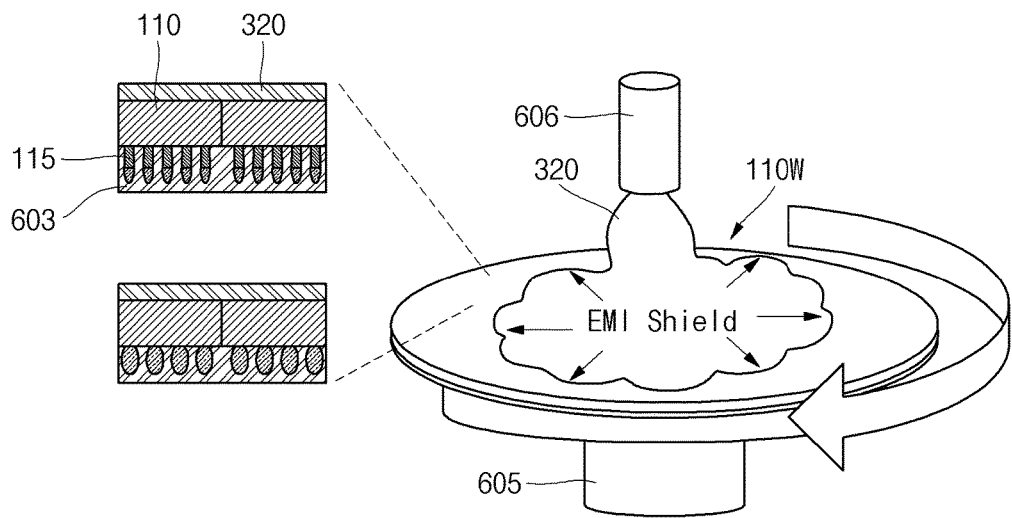

As illustrated in FIG. 8C, the wafer 110W may be mounted on a spin coating apparatus 605. In particular, the wafer 110w may be adhered to the spin coating apparatus 605 via the bump protecting tape 603. A slurry for forming an EMI shield layer 320 may then be spin-coated on the back side of the wafer 110W. In addition to the spin coating, the EMI shield layer 320 may also be formed by spraying, printing, and/or laminating.

Figure 11:
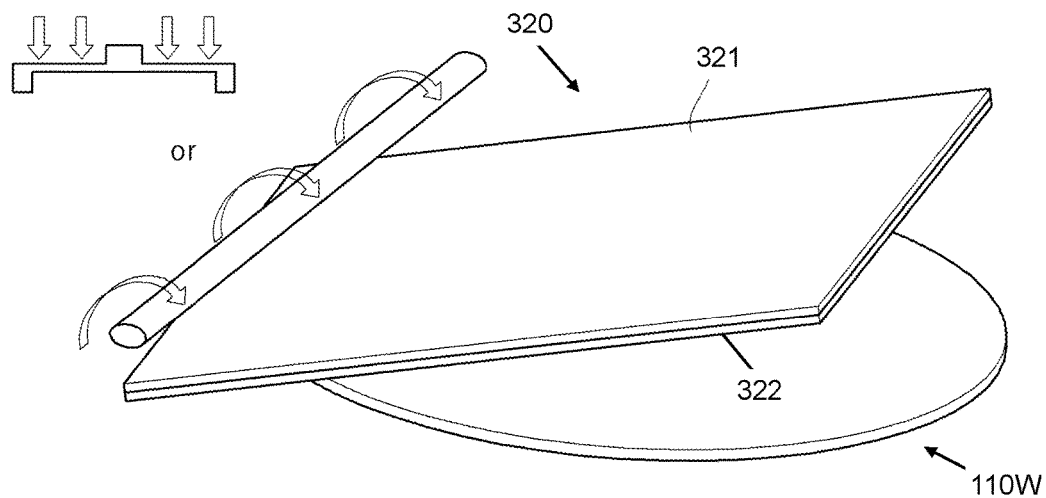
FIG. 11 illustrates a copper foil lamination process step that may be an alternative to the spin-coating process step of FIG. 8C for various example embodiments of the present disclosure.

In yet other embodiments, the EMI shield layer 320 may be formed using a conductive foil 321 such as a copper foil. In particular, in such embodiments, a conductive foil 321 having a copper layer 322 and an adhesive layer 323 may be rolled or vacuum laminated on the back side of the wafer 110W as shown in FIG. 11. In some embodiments, the copper layer 322 may have a thickness of at least 12 µm and the adhesive layer 323 may have a thickness of at least 10 µm, thus resulting in the copper foil 321 having a thickness of at least 22 µm.

Since the wafer 110W has not been diced before the spin coating or laminating of the EMI shield layer 320, a gap is not created between each of the semiconductor dies 110 and its adjacent semiconductor die 110 as in the method of FIGS. 7A-7M. As such, the spin-coating apparatus 605 in the method of FIGS. 8A-8J does not form the EMI shield layer 320 between adjacent semiconductor die 110, but only on the back side of the wafer 110W.

Figure 8D:
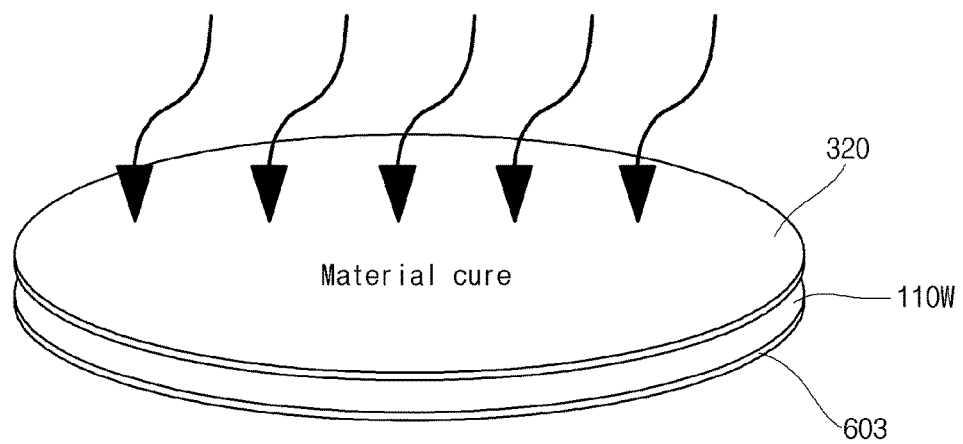
Figure 8E:
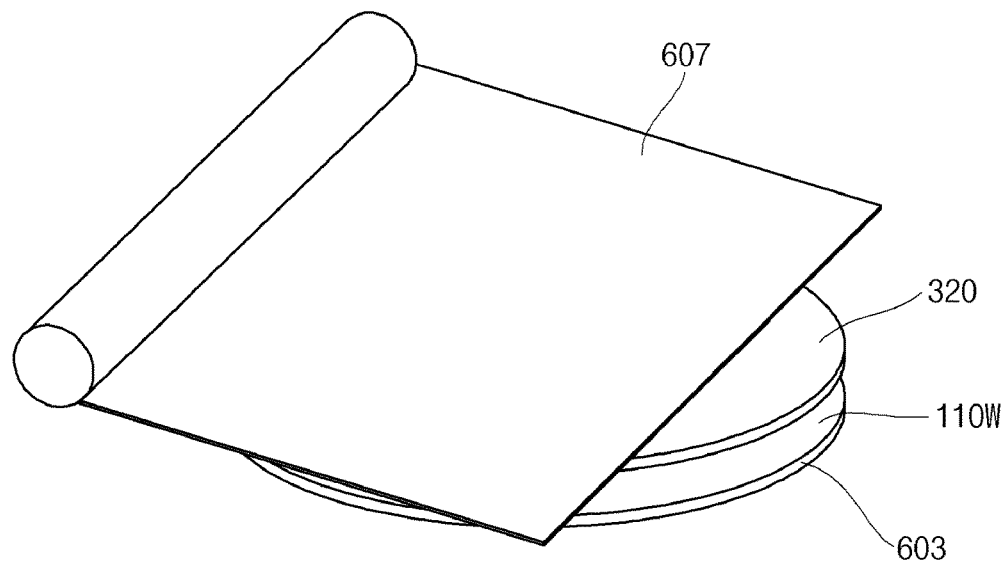
Figure 8F:
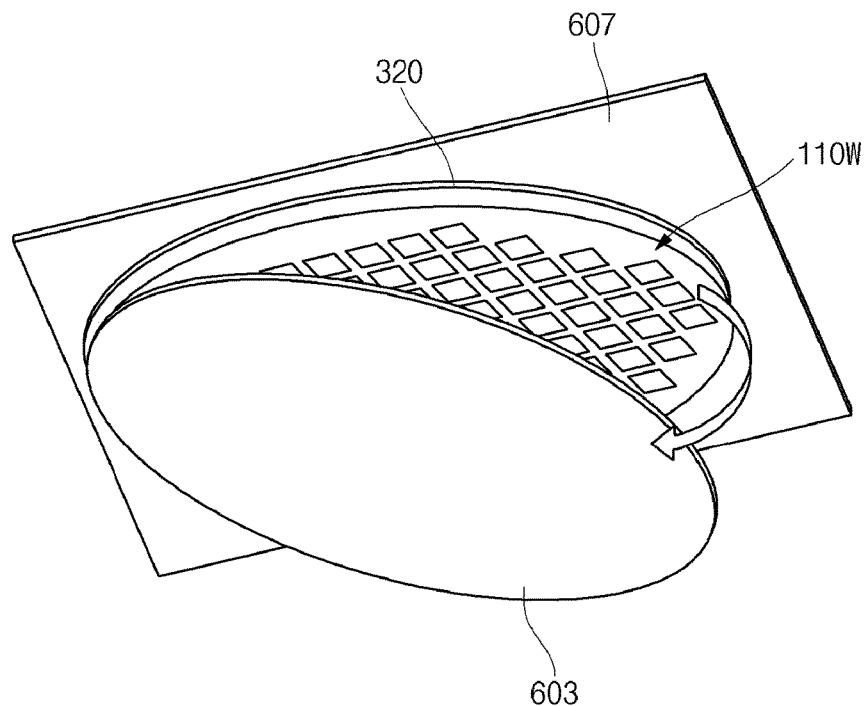

As illustrated in FIG. 8D, the spin-coated EMI shield layer 320 may be cured and/or sintered by heat and/or light. A wafer mount tape 607 may then be laminated on a surface of the cured and/or sintered EMI shield layer 320 as illustrated in FIG. 8E. As illustrated in FIG. 8F, the bump protecting tape 603 may be peeled off and removed. Accordingly, the front side of the wafer 110W may be exposed to the outside.

Figure 8G:
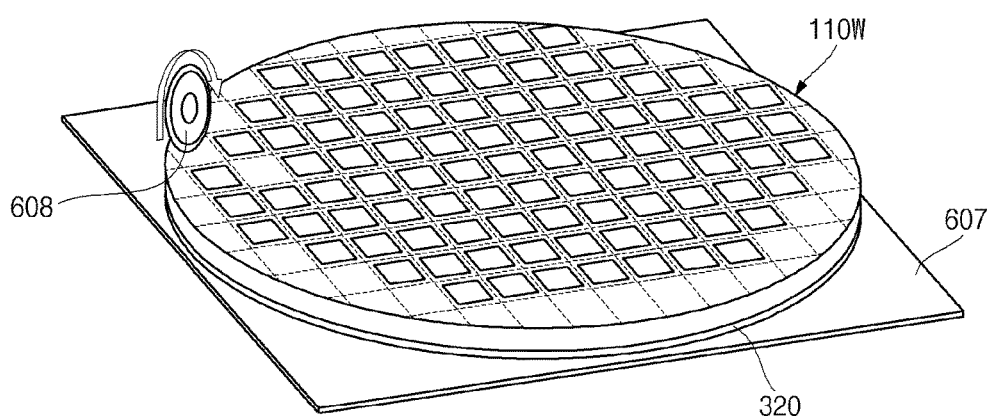

As illustrated in FIG. 8G, dicing may be performed by a dicing tool 608, such as a diamond wheel or a laser beam, along street lines provided on the wafer 110W. The plurality of semiconductor dies 110 formed on the wafer 110W may be separated by performing the dicing individually or by groups. As a result, third surfaces 113 of the plurality of semiconductor dies 110 may be directly exposed to the outside. In particular, the third surfaces 113 of the plurality of semiconductor dies 110 may directly exposed to the outside while EMI shield layer 320 shields the first surfaces 111 of the plurality of semiconductor dies 110.

Figure 8H:
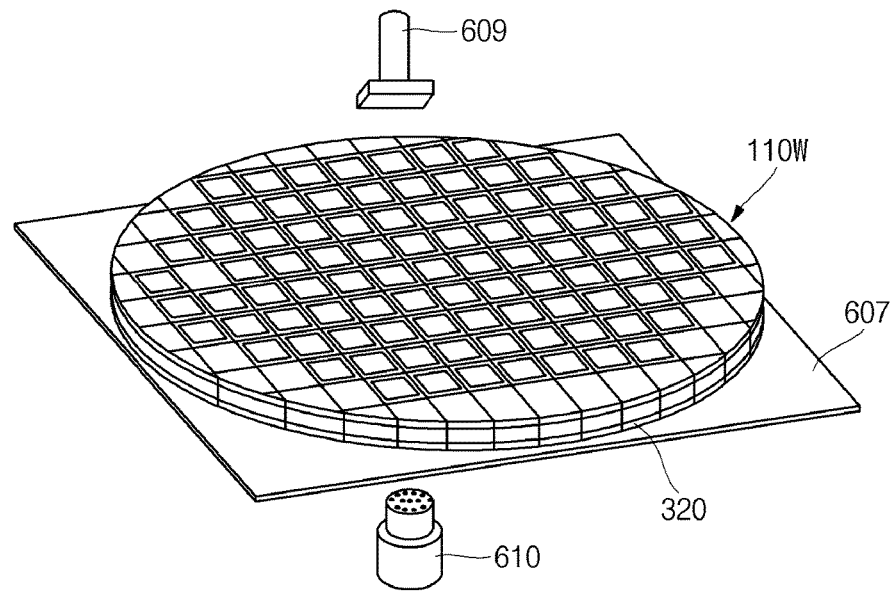
Figure 8I:
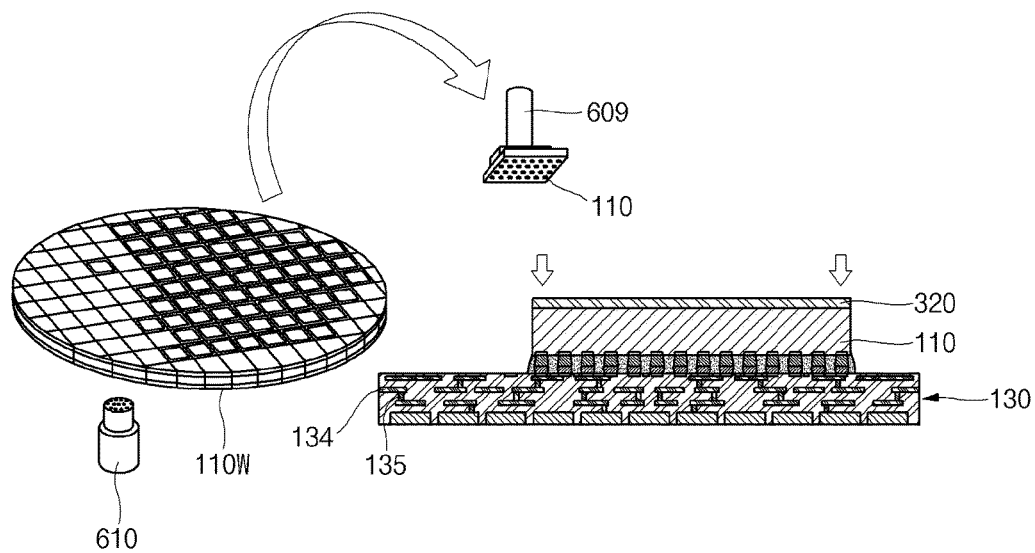

As illustrated in FIG. 8H, the separated individual or groups of semiconductor dies 110 are picked up from the wafer 110W by operations of the pickup tool 609 and the eject pin 610. As illustrated in FIG. 8I, the semiconductor dies 110 may be placed on the substrate 130. In this manner, the EMI shield layer 320 may be formed only on top surfaces (e.g., first surfaces 111) of the semiconductor dies 110. After the semiconductor dies 110 are picked up and placed on the substrate 130, internal interconnection structures 115 of the semiconductor dies 110 may be electrically connected to the substrate 130 by mass reflowing or thermal compression.

Figure 8J:
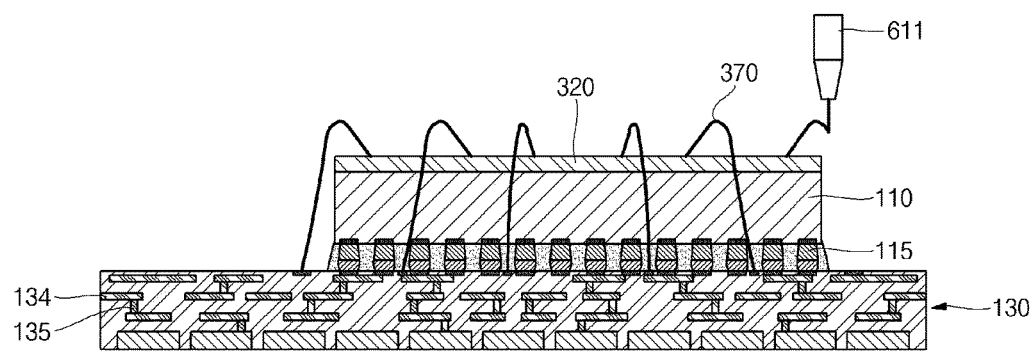

As illustrated in FIG. 8J, a wire bonder 611 may electrically connect the EMI shield layer 320 formed on the semiconductor dies 110 to a ground circuit pattern of the substrate 130 via EMI shielding wires 370. In particular, the wire bonder 611 may surround the semiconductor dies 110 with a plurality of EMI shielding wires 370. Therefore, the top surfaces (e.g., the first surfaces 111) of the semiconductor dies 110 may be shielded from electromagnetic waves by the EMI shield layer 32. The side surfaces (e.g., third surfaces 113) of the semiconductor dies 110 may shielded from electromagnetic waves by the EMI shielding wires 370.

Figure 9A:
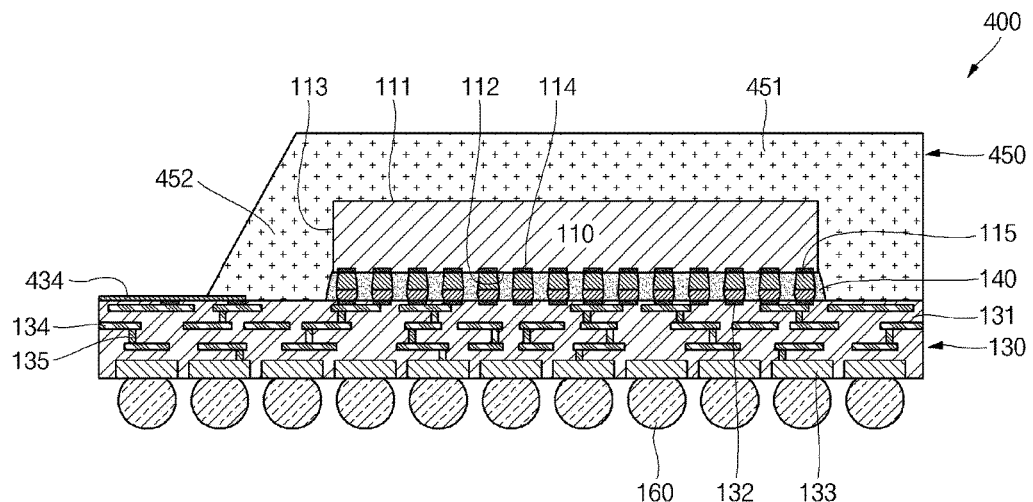
FIGS. 9A-9C are cross-sectional views sequentially illustrating process steps of a manufacturing method of a semiconductor device according to various example embodiments of the present disclosure.
Figure 9B:
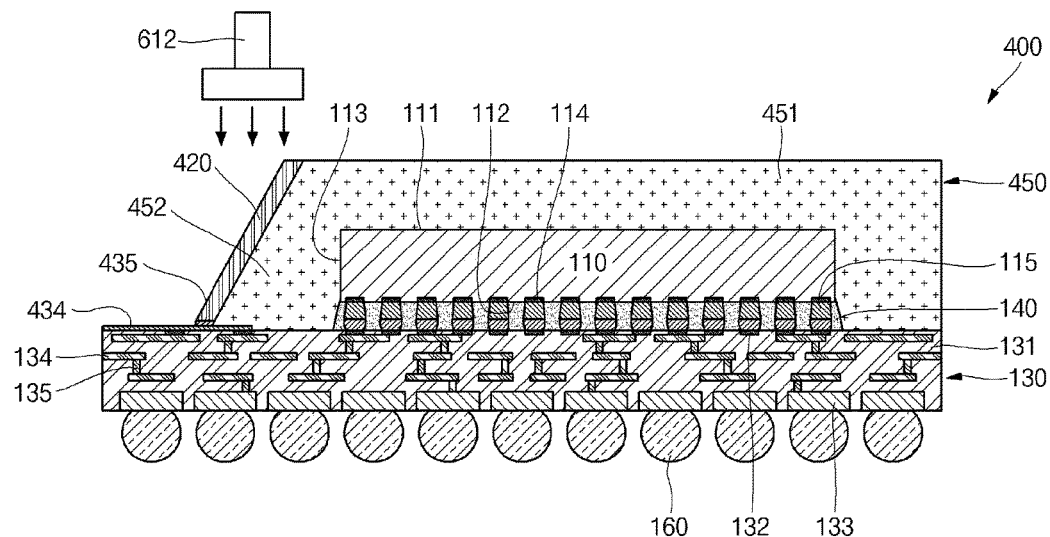
Figure 9C:
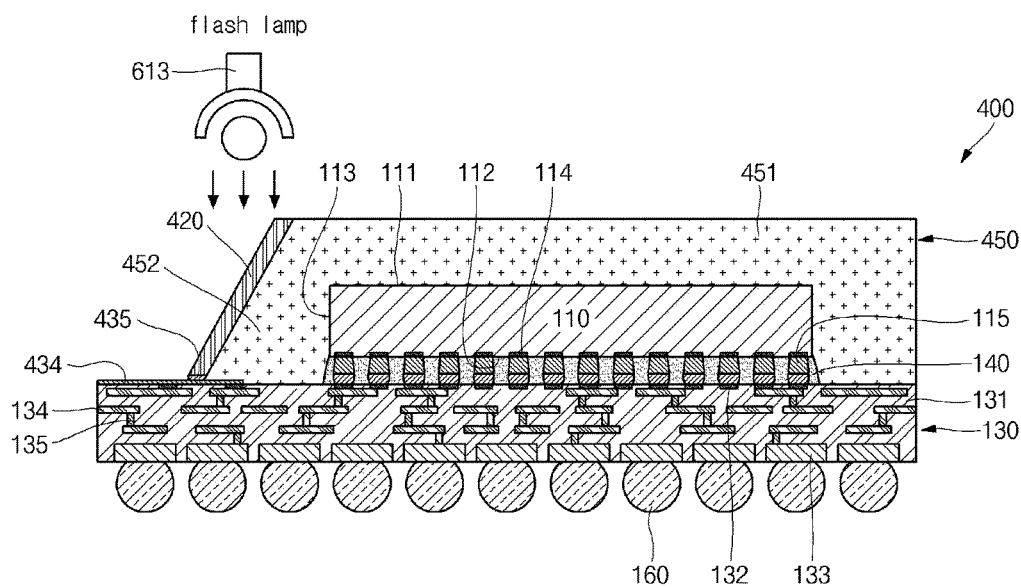

FIGS. 9A-9C depict cross-sectional views sequentially illustrating process steps of a manufacturing method of a semiconductor device according to various example embodiments of the present disclosure. In particular, the manufacturing method is described with reference to the semiconductor device 400, FIGS. 4A-4B, and FIGS. 9A-9C.

As illustrated in FIG. 9A, the semiconductor die 110 placed on the substrate 130 may be encapsulated by the encapsulating portion 450 of the semiconductor device 400. Moreover, an antenna pattern 434 of the substrate 130 may be exposed to the outside. The encapsulating portion 450 may be divided into a first region 451 that encapsulates the first surface 111 of the semiconductor die 110 and a second region 452 that encapsulates the third surfaces 113 of the semiconductor die 110. The antenna pattern 434 may be exposed and may protrude to the outside through the second region 452 of the encapsulating portion 450.

As illustrated in FIG. 9B, a printer 612 may print the EMI shield layer 420 using an EMI shielding material such as conductive ink. In particular, the printer 612 may print the EMI shield layer 420 only on the second region 452 of the encapsulating portion 450 and electrically disconnected from the antenna pattern 434. Further, the EMI shield layer 420 may be electrically connected to a ground circuit pattern 432.

As illustrated in FIG. 9C, a flash lamp 613 may sinter and/or cure the printed EMI shield layer 420. In particular, the flash lamp 613 may include a Xenon lamp and a reflector that photo-sinter the EMI shield layer 420 by intense pulsed light (IPL). In an example embodiment, the flash lamp 613 may radiate the EMI shield layer 420 with pulsed light for approximately 0.1 µs to approximately 100 µs. The pulsed light may sinter metal particles or metal oxide particles contained in the conductive ink to form the EMI shield layer 420.

Referring to FIGS. 10A-10D, cross-sectional views sequentially illustrating process steps of a manufacturing method of a semiconductor device according to various embodiments of the present disclosure are illustrated. The manufacturing method is described with reference to the semiconductor device 500, FIG. 5, and FIGS. 10A-10D.

Figure 10A:
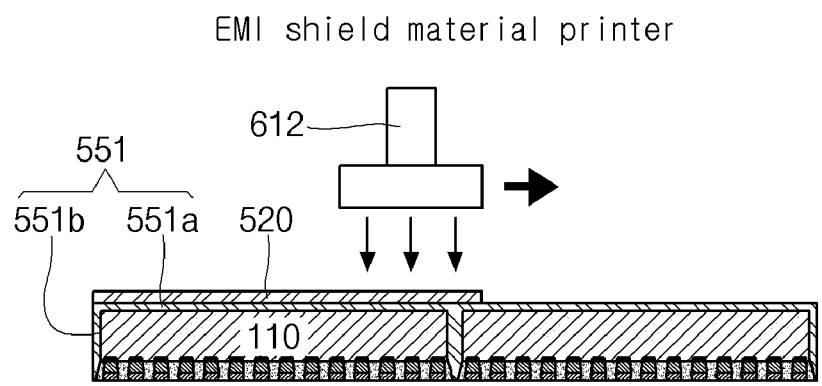
FIGS. 10A-10D are cross-sectional views sequentially illustrating process steps of a manufacturing method of a semiconductor device according to various example embodiments of the present disclosure.

As illustrated in FIG. 10A, a first encapsulating portion 551 may encapsulate the semiconductor dies 110. Further, a printer 612 may print an EMI shielding material on a surface of the first encapsulating portion 551 to form an EMI shield layer 520. In particular, a first region 551a of the first encapsulating portion 551 may be formed on first surfaces 111 of the semiconductor dies 110, a second region 551b of the first encapsulating portion 551 may be formed on third surfaces 113 of the semiconductor dies 110, and the EMI shield layer 520 having a predetermined thickness may be printed on the first region 551a of the first encapsulating portion 551 without forming the EMI shield layer 520 on the second region 551b of the first encapsulating portion 551. As shown, the second region 551b of the first encapsulating portion 551 may be interposed between first and second semiconductor dies 110. In particular, the second region 551b of the first encapsulating portion 551 may be inserted into a region between the third surfaces 113 of the first and second semiconductor dies 110.

Figure 10B:
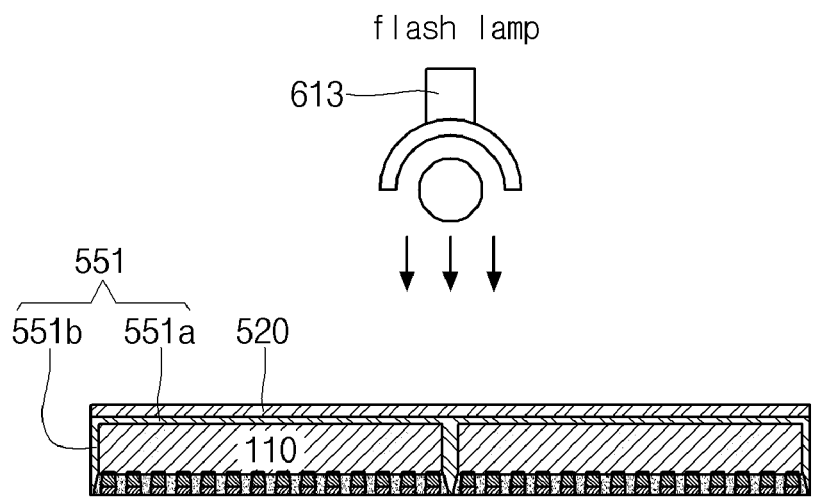

As illustrated in FIG. 10B, a flash lamp 613 may be photo-sinter the EMI shield layer 520 formed on the first region 551a with radiated light. In particular, the EMI shield layer 520 may be formed in a liquid or gel phase. The radiated light from flash lamp 613 may convert the liquid or gel phase EMI shield layer 520 into a solid phase, rigidly cured on the first encapsulating portion 551.

Figure 10C:
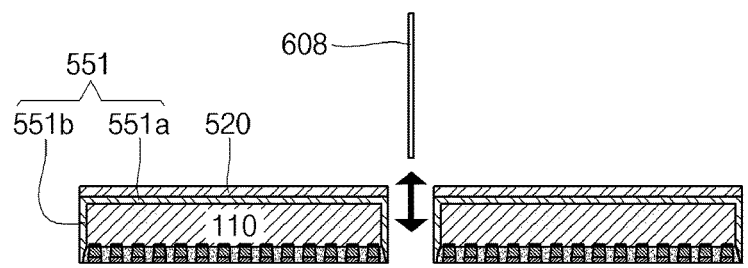

As illustrated in FIG. 10C, a dicing tool 608 may separate the first semiconductor die 110 from the second semiconductor die 110. In particular, such separating may result in the separated EMI shield layer 520 and the second region 551b of the first encapsulating portion 551 being coplanar.

Figure 10D:
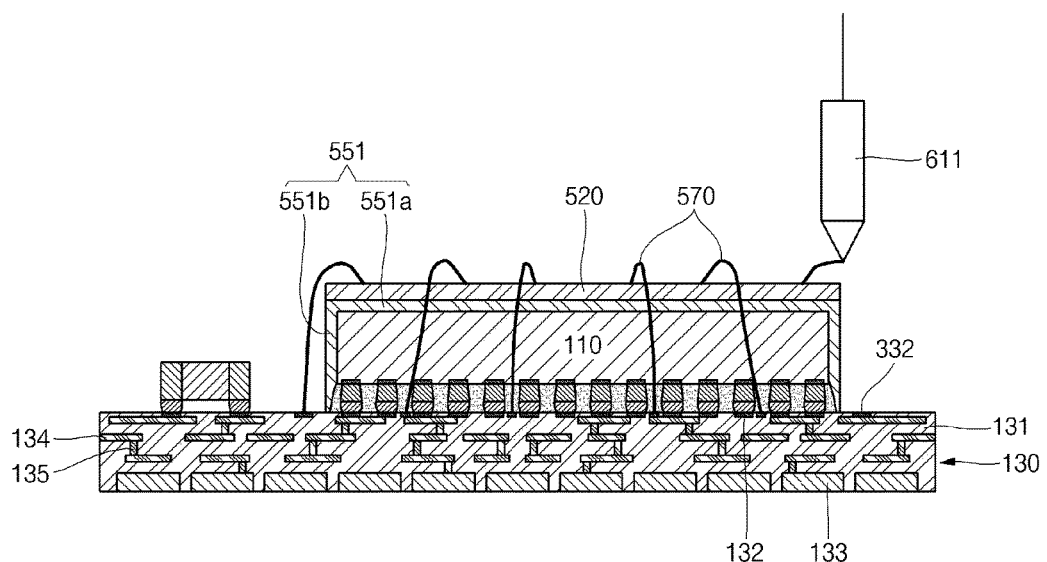

After such separating, the first semiconductor die 110, including the first encapsulating portion 551 and the EMI shield layer 520, may be electrically connected to a substrate 130 by mass reflowing or thermal compression as illustrated in FIG. 10D. A wire bonder 611 may form a plurality of EMI shielding wires 570 in vicinity of the first encapsulating portion 551. In particular, the wire bonder 611 may bond first ends of the EMI shielding wires 570 to the EMI shield layer 520 and second ends of the EMI shielding wires 570 to a ground circuit pattern 332 of a substrate 130.

Thereafter, the first encapsulating portion 551, the EMI shield layer 520, and the EMI shielding wires 570 may be encapsulated by the second encapsulating portion 552, and a plurality of external interconnection structures 160 may be formed on a bottom surface of the substrate 130. As described above, some embodiments may omit the second encapsulating portion 552. In such embodiments, the semiconductor device may be sold with the EMI shield layer 520 and the EMI shielding wires 570 exposed.

While the semiconductor device of the present disclosure and the manufacturing thereof have been particularly shown and described with reference to exemplary embodiments thereof, it will be understood by those of ordinary skill in the art that various changes in form and details may be made therein without departing from the spirit and scope of the present disclosure as defined by the following claims.

What is claimed is:

1. A semiconductor device comprising:
   a semiconductor die including a first surface, a second surface opposite to the first surface, a third surface formed between the first surface and the second surface, and a plurality of interconnection structures formed on the second surface;
   an EMI shield layer contacting the first surface and the third surface of the semiconductor die;
   a substrate electrically connected to the plurality of interconnection structures of the semiconductor die;
   an encapsulating portion encapsulating the EMI shield layer and the substrate, the encapsulating portion comprising a mold material adhered to the EMI shield layer; another semiconductor die horizontally spaced apart from the semiconductor die; and wherein the EMI shield layer fills a gap between the semiconductor die and the other semiconductor die with EMI shielding material to a level that at least surpasses the second surface of the semiconductor die.

2. The semiconductor device of claim 1, wherein the semiconductor die comprises:
   a contact pad electrically connected to an interconnection structure of the plurality of interconnection structures; and
   a ground circuit pattern electrically connecting the contact pad and the EMI shield layer.

3. The semiconductor device of claim 1, where in the EMI shield layer comprises a material selected from a conductive polymer, a conductive ink, a conductive paste, and a conductive foil.

4. The semiconductor device of claim 1, further comprising an underfill that fills a gap between the semiconductor die and the substrate.

5. The semiconductor device of claim 1, wherein the EMI shield layer comprises a non-sputtered EMI shield layer.

6. The semiconductor device of claim 1, wherein the EMI shield layer comprises a copper foil.

7. The semiconductor device of claim 1, wherein the EMI shield layer comprises a spin-coated EMI shield layer.

8. The semiconductor device of claim 1, wherein the EMI shield layer comprises a jet-printed EMI shield layer.

9. A semiconductor device comprising:
   a semiconductor die including a first surface, a second surface opposite to the first surface, a third surface formed between the first surface and the second surface, and a plurality of interconnection structures formed on the second surface;
   a non-sputtered EMI shield layer comprising an upper surface and a lower surface opposite the upper surface, wherein the lower surface faces the first surface of the semiconductor die;
   a plurality of EMI shielding wires positioned about the third surface of the semiconductor die, the plurality of EMI shielding wires physically and electrically connected to the upper surface of the non-sputtered EMI shield layer;
   a substrate comprising a first substrate surface, a second substrate surface opposite the first substrate surface, conductive traces, and a ground circuit pattern exposed on the first substrate surface, wherein the plurality of interconnection structures of the semiconductor die are physically connected to the conductive traces exposed on the first substrate surface, and wherein the plurality of EMI shielding wires are physically and electrically connected to the ground circuit pattern exposed on the first substrate surface; and
   an encapsulating portion encapsulating and directly contacting the non-sputtered EMI shield layer, the EMI shielding wires, and the first substrate surface.

10. The semiconductor device of claim 9, wherein the non-sputtered EMI shield layer comprises a material selected from a conductive polymer, a conductive ink, a conductive paste, and a conductive foil.

11. The semiconductor device of claim 9, wherein the plurality of EMI shielding wires traverse and inductively shield the third surface of the semiconductor die.

12. The semiconductor device of claim 11, wherein the plurality of EMI shielding wires are spaced apart from the third surface of the semiconductor die.

13. The semiconductor device of claim 9, wherein:
the non-sputtered EMI shield layer has a rectangular shape with four sides; and
the plurality of EMI shielding wires are arranged along the four sides.

14. A semiconductor device comprising:
a semiconductor die including a first surface, a second surface opposite to the first surface, a third surface formed between the first surface and the second surface, and a plurality of interconnection structures formed on the second surface;
a substrate electrically connected to the plurality of interconnection structures of the semiconductor die;
an encapsulating portion encapsulating the first surface of the semiconductor die and the third surface of the semiconductor die, the encapsulating portion comprising a first surface over the first surface of the semiconductor die and a side surface between the first surface of the encapsulating portion and the substrate; and
an EMI shield layer comprising a first surface on the side surface of the encapsulating portion and a second surface opposite the first surface of the EMI shield layer, wherein the second surface of the EMI shield layer slants from the substrate toward the semiconductor die and the first surface of the encapsulating portion, and wherein at least a portion of the first surface of the encapsulating portion is exposed by the EMI shield layer.

15. The semiconductor device of claim 14, wherein the substrate further includes an antenna pattern that traverses the EMI shield layer.

16. The semiconductor device of claim 14, wherein the EMI shield layer comprises a non-sputtered EMI shield layer.

17. The semiconductor device of claim 15, wherein the EMI shield layer shields the semiconductor device from the antenna pattern.

18. The semiconductor device of claim 15, wherein the encapsulating portion further encapsulates the antenna pattern.

19. The semiconductor device of claim 15, wherein the antenna pattern extends beyond the encapsulating portion.

* * * * *